US012619090B2

(12) United States Patent
Seesselberg et al.

(10) Patent No.: US 12,619,090 B2
(45) Date of Patent: May 5, 2026

(54) MULTIBEAM 3-D FOCUS GENERATOR

(71) Applicant: Carl Zeiss SMT GmbH, Oberkochen (DE)

(72) Inventors: Markus Seesselberg, Aalen (DE); Johannes Stock, Ellwangen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 425 days.

(21) Appl. No.: 18/196,501

(22) Filed: May 12, 2023

(65) Prior Publication Data

US 2023/0367134 A1 Nov. 16, 2023

(30) Foreign Application Priority Data

May 13, 2022 (DE) .......................... 102022204688.9

(51) Int. Cl.

| | |
|---|---|
| *G02B 27/10* | (2006.01) |
| *C03B 33/10* | (2006.01) |
| *C03C 23/00* | (2006.01) |
| *G01J 9/00* | (2006.01) |
| *G02B 19/00* | (2006.01) |
| *G02B 27/00* | (2006.01) |
| *G02B 27/16* | (2006.01) |
| *G02F 1/1362* | (2006.01) |
| *G03F 9/00* | (2006.01) |

(52) U.S. Cl.
CPC ............ *G02B 27/16* (2013.01); *C03B 33/102* (2013.01); *C03C 23/0025* (2013.01); *G01J 9/00* (2013.01); *G02B 19/0009* (2013.01); *G02B 19/0047* (2013.01); *G02B 27/0075* (2013.01); *G02B 27/1093* (2013.01); *G02F 1/136277* (2013.01); *G03F 9/7026* (2013.01); *G02B 27/106* (2013.01); *G02F 2203/12* (2013.01); *G02F 2203/50* (2013.01)

(58) Field of Classification Search
CPC .......................... G02B 27/0075; G02B 27/106
See application file for complete search history.

(56) References Cited

U.S. PATENT DOCUMENTS

| | | | |
|---|---|---|---|
| 2011/0000897 A1 | 1/2011 | Nakano et al. | |
| 2011/0193269 A1 | 8/2011 | Ito et al. | |

(Continued)

FOREIGN PATENT DOCUMENTS

| | | |
|---|---|---|
| CN | 103934577 | 7/2014 |
| CN | 109416507 | 3/2019 |

(Continued)

OTHER PUBLICATIONS

The Office Action issued by the Japanese Patent Office for Application No. JP 2023-080238, dated Dec. 2, 2024 (with English Translation).

(Continued)

*Primary Examiner* — Joseph P Martinez
(74) *Attorney, Agent, or Firm* — Fish & Richardson P.C.

(57) ABSTRACT

The invention relates to a device for focusing a photon beam into a material. The device comprises: means for splitting the photon beam into a plurality of component beams; means for focusing the component beams at a predetermined focal depth within the material; and means for adapting the wavefronts of the component beams based at least in part on the focal depth.

33 Claims, 16 Drawing Sheets

(56)             References Cited

U.S. PATENT DOCUMENTS

| | | | |
|---|---|---|---|
| 2016/0052088 A1 | 2/2016 | Kawaguchi et al. | |
| 2017/0326688 A1 | 11/2017 | Turner et al. | |
| 2018/0117709 A1 | 5/2018 | Wetzig et al. | |
| 2019/0170991 A1* | 6/2019 | Seesselberg | G03F 1/72 |
| 2020/0164470 A1 | 5/2020 | Booth et al. | |

FOREIGN PATENT DOCUMENTS

| | | |
|---|---|---|
| DE | 102016214695 | 10/2017 |
| JP | 2003-334683 | 11/2003 |
| JP | 2007-229758 | 9/2007 |
| JP | 2009-034723 | 2/2009 |
| JP | 2010-075997 | 4/2010 |
| JP | 2010-260062 | 11/2010 |
| JP | 2017-064736 | 4/2017 |
| JP | 2019-532350 | 11/2019 |
| JP | 2020-529925 | 10/2020 |
| JP | 2023-035534 | 3/2023 |
| WO | WO 2014/156692 | 10/2014 |
| WO | WO 2017/073907 | 5/2017 |
| WO | WO 2018/182946 | 10/2018 |
| WO | WO 2021/117557 | 6/2021 |

OTHER PUBLICATIONS

The Office Action issued by the Korean Patent Office for Application No. KR 10-2023-0061634, dated Dec. 6, 2024 (with English Translation).

The Office Action issued by the Japanese Patent Office for Application No. JP 2023-082238, dated Apr. 8, 2024 (English Translation Only).

The Office Action issued by the German Patent Office for Application No. DE 10 2022 204 688.9, dated Jan. 10, 2023 (with English Translation).

Seesselberg et al., "Optical design of ZEISS FurTune photo mask tuning system: How to generate diffraction-limited laser foci in thick specimens", *Proceedings of SPIE*, vol. 10690, pp. 1060900Y-1-1060900Y-15 (Jun. 5, 2018).

The European Search Report issued by the European Patent Office for Application No. EP 23169295.5, dated Oct. 2, 2023.

"Adaptive Optics", Retrieved from the Internet: URL:https://web.archive.org/web/20220225155401/https://en.wikipedia.org/wiki/Adaptive_optics (Retrieved on Sep. 22, 2023).

* cited by examiner

MULTIBEAM 3-D FOCUS GENERATOR

CROSS-REFERENCE TO RELATED APPLICATIONS

The present patent application claims the priority of the German patent application DE 10 2022 204 688.9, entitled "Multi-Strahl 3D Fokus Generator," which was filed at the German Patent and Trade Mark Office on May 13, 2022. The German patent application DE 10 2022 204 688.9 is incorporated by reference in its entirety in the present patent application.

TECHNICAL FIELD

The present invention relates to a device for focusing a photon beam into a material, a corresponding method and computer program.

BACKGROUND

In the field of optical technologies, applications in which a photon beam is focused within a material in a targeted manner are increasingly tinder discussion. By way of example, applications are known, in which a reaction is generated in the region of the focus of the photon beam in the material, wherein the reaction can locally modify the material in this region or locally transform the material (permanently) into a different state. For application-specific focusing, it may be helpful to place the focus of the photon beam with a defined optical quality and in a targeted manner at different positions within the three-dimensional space of the material, wherein the optical quality should be ensured independently of the position (e.g., with respect to the focal depth, the spatial coordinates) in order to allow a reliable application, for example in the case of an application within the scope of a local material modification. In some applications, the local modification may for example comprise the change of any desired physical property of the material (e.g., a change in a mechanical, an optical and/or a chemical property, etc.).

For example, applications are known, in which the focus is introduced in a targeted manner into an object for lithography for the purpose of processing the said object. By way of example, reference in this respect is made to US 2019/170991 A1. In this case, the object may comprise a lithography mask for example. By introducing the focus of a photon beam within the mask, it is possible in the process to implement a corresponding local modification, for example a repair or correction of the mask.

Further, other applications that may require focusing within the material are also known, for example within the scope of a (three-dimensional) polymerization (e.g., a multiphoton polymerization), laser drilling in a transparent medium (e.g., in glass), a production of microfluidic systems, etc. In this context, it may be assumed that further applications requiring reliable focusing of a photon beam within a material may arise in future.

In previous applications, desired foci with a defined optical quality can be produced within a certain parameter space. However, the parameter space for a satisfactory quality is usually spatially restricted to a certain portion of the material. Moreover, known focus systems usually have time restrictions in relation to the focus generation since the number of foci that can be generated per unit time are often subject to a technical limitation of the system set-up. Further, it may be technically desirable for the focusing to be able to occur with a suitable optical quality within the material, even in the case of different materials or material surrounds (e.g., this should also be ensured in the case of different refractive indices for different materials and material surrounds).

However, previous approaches could only partly fulfil the technically desired requirements within the scope of focusing.

It is therefore a general aspect of the present invention to improve the focusing within a material.

SUMMARY

This general aspect is at least partly achieved by the various aspects of the invention.

A first aspect relates to a device for focusing a photon beam into a material. The device comprises a means for splitting the photon beam into a plurality of component beams and a means for focusing the component beams at a predetermined focal depth within the material. Further, the device may comprise a means for adapting the wavefronts of the component beams based at least in part on the focal depth.

Accordingly, the invention can allow not only the introduction of one photon beam within the material but the possibility of introducing a plurality of component beams into the material. In the process, the plurality of component beams can be focused (substantially) simultaneously into the material, with the result that a plurality of foci are present (substantially) simultaneously at the predetermined focal depth. In this case, the foci at the predetermined focal depth may be in the form of spatially separable and distinguishable foci, which for example are situated at different surface coordinates at the predetermined focal depth.

Thus, the invention may firstly allow the parallel or simultaneous generation of foci within a material; this may be advantageous for various applications. The scope of processing the material may require, for example, the placement of a plurality of foci at different positions, for example at one focal depth (or depth plane) in the material. Without splitting the photon beam, the photon beam would to this end have to be focused sequentially at the different positions in the focal depth, for example by way of a plurality of steps, wherein each individual focusing may comprise, for example, a separate exposure (or effect) of the photon beam, a separate positioning of the photon beam and/or a separate adjustment of the focus. By contrast, the split of the photon beam according to the invention provides a parallel approach, in which a plurality of foci can be generated by way of merely one exposure (or effect) of the photon beam, with the result that the technical effort when generating the plurality of foci can be minimized. Further, the apparatus according to the invention can allow the simultaneously present foci of the component beams to have the same focal depth within the material. It is therefore possible to ensure that the foci of the component beams are present in one depth plane of the sample, with the foci (merely) differing in terms of their lateral position in the depth plane. Further, this parallel approach can enable an increase in the throughput when generating foci since a plurality of foci can be generated simultaneously within the scope of one exposure (or effect) with the photon beam. In this case, the increase in throughput may assume, for example, a factor that can scale with the number of the plurality of component beams. By way of example, focusing the component beams can be assumed to take the same amount of time as focusing one photon beam within the material. Depending on the number of the plurality of component beams (e.g., at least two, at least three, at least ten, etc.), the time required for generating the plurality of foci can be reduced accordingly (e.g., to one half, to one third, to one tenth, etc.). This may be accompanied by very significant time savings, especially for applications within the scope of correcting lithography masks, in the case of which it is necessary to introduce an extremely large multiplicity of foci. These time savings may also be useful in any other application of the focusing described herein, for example within the scope of a photopolymerization when focusing the component beams into a photopolymer and/or within the scope of glass drilling or structuring of glass, for example for microfluidic devices.

The inventors have further also recognized that focal depth-dependent influences may be present within the scope of focusing and may influence the optical quality of the foci of the component beams. Here, these influences may be taken into account by way of the means for adapting the wavefronts of the component beams, in order to be able to ensure a desired focus quality. Without such an adaptation means, the optical quality of the foci (e.g., the foci of the component beams) would in reality be subject to (significant) variations within the three-dimensional space of the material, and so a technical requirement of the foci within the scope of an application cannot always be ensured to a sufficient extent. However, by taking account of the focal depth and by adapting the wavefronts accordingly, the invention enables a three-dimensional focus generator which is able to reliably generate foci with a defined focus quality over an entire depth of a material.

In an example, the wavefronts of the component beams may be adapted based on the (predetermined) focal depth of the component beams. The adaptation characteristic of the wavefronts intended to be implemented in relation to a present focal depth of the component beams may be for example predetermined (or else stored). The adaptation characteristic of the wavefronts may be described, for example, by way of a function which comprises the focal depth of the component beams as a parameter. By way of example, the adaptation characteristic of the wavefronts may also be stored in a database which comprises a focal depth of the component beams and the corresponding wavefront adaptation characteristic as parameters. In this case, the adaptation means may be suitable for imposing a desired property on the wavefront (e.g., on the shape of the wavefront) of a component beam. By way of example, the shape of the wavefront can be adapted as desired by way of the adaptation means. It should be mentioned that, in an example, the photon beam or the component beams may first of all have an initial wavefront (e.g., a (substantially) plane or spherical wavefront). In this case, the initial wavefront may have resulted from for example a beam source from which the photon beam was emitted (and accordingly also be present, for example, as wavefront in the component beams). The adaptation means can be used to modify this initial wavefront (e.g., the corresponding initial shape of the wavefront) in accordance with the focal depth of the component beams. By way of example, the adaptation means may comprise a wavefront manipulator, wherein the adaptation means may for example comprise a deformable mirror, a spatial light modulator (SLIM) and/or an adaptive optical unit. Further, it is also conceivable that the adaptation means may comprise an Alvarez element with two non-rotationally symmetric surfaces that are movable relative to one another. By way of example, the device may comprise a user interface, by means of which a specific focal depth can be set and/or programmed, wherein the focusing means and/or the material is automatically arranged by the device so that the focal depth sets in. The adaptation means can then also be adjusted automatically by the device, for example on the basis of the focal depth.

The predetermined focal depth can be understood to be a focal depth set in a targeted manner. In this case, the predetermined focal depth may comprise a depth over the entire material depth or material thickness. By way of example, the predetermined focal depth d may be predetermined in the range $0 \text{ mm} \leq d \leq t$, where t may for example range between 1 mm and 20 mm, for example be at least 3 mm, at least 5 mm, at least 10 mm or at least 15 mm. By way of example, the predetermined focal depth may also comprise (substantially) zero should the focus be located on the material surface. Consequently, a predetermined focus quality can be obtained over the entire thickness of a material, independently of the focal depth.

It is further mentioned that the predetermined focal depth may correspond to a depth of the material which may be defined in relation to a plane (or a point) of the material, for example the material surface where the component beams are incident or emerge from. It is also conceivable for the focal depth to be defined by way of a distance traversed by a chief ray (or any other (component) ray) of a component beam, from the entrance into the material to the focus or focal region of the component beam. It is mentioned that the predetermined focal depth need not necessarily be identical for all foci of the component beams. In an example, the predetermined focal depth may relate to a focal depth of precisely one component beam, wherein, for example, it is possible to assume (from the optical set-up of the device) that the further component beams and their foci have substantially the same dimension (e.g., with a small deviation or else no deviation) as the predetermined focal depth.

The means for splitting (which can also be termed splitting means) may comprise a means which receives the photon beam and splits (or converts) the latter into a plurality of spatially separable beams. By way of example, the splitting means may comprise a splitter which is able to split an incident beam (e.g., the photon beam) into a plurality of beams (e.g., the plurality of component beams). For example, the means for splitting may comprise a photon beam splitter comprising one or more optical elements configured to split the photon beam into a plurality of component beams. The means for splitting can split the photon beam, for example, into at least two, preferably at least three, more preferably at least four, most preferably at least five component beams. The device can be configured so that the photon beam can be directed at the splitting means in a targeted manner. Further, it is also conceivable that the means for splitting can be variably introduced into or removed from an optical axis of the device such that the photon beam can be selectively split. By way of example, it is possible to attach a plurality of different means for splitting on a turret such that a rotation of the turret allows a different number of component rays and/or a different arrangement of the foci in the material to be chosen.

The means for focusing (which can also be termed focusing means) may comprise means configured to receive the (adapted) component beams and focus the latter at the predetermined focal depth within the material. The means for focusing may be arranged so that it is also able to focus the photon beam at the predetermined focal depth should the latter not be split into the plurality of component beams, for example by way of the splitting means. The means for focusing may comprise, for example, a focusing unit and/or an objective which comprises one or more (optical) elements (e.g., one or more lenses) for focusing the component beams. Optical elements of this focusing unit can be displaced in the process, for example along their optical axis. By way of example, the focusing unit may also comprise switchable optical elements, for example Alvarez plates and/or liquid-filled lens elements. In an example, the component beams can be focused, in particular, for processing the material. In an example, the device may be configured in such a way that the component beams are focused within the material in such a way that the material is (physically) modified in the region of the foci of the component beams. By way of example, this can be ensured by way of a suitable intensity and/or power of the component beams.

For example, the means for focusing may comprise a focusing unit comprising one or more lenses configured to focus a component beam of the plurality of component beams at a predetermined focal depth within the material.

In an example the means for adapting (which can also be termed adaptation means) can be configured in such a way that the wavefronts are adapted so as to generate a given focus quality of the foci of the component beams at the predetermined focal depth. For example, this can be implemented so that a first given focus quality is generated at a first predetermined focal depth. The invention can therefore allow the focus quality of the component beams to be adjusted in a targeted manner to a given focus quality by way of the adaptation of the wavefronts. Hence, for example, it is possible to ensure the same (optical) focus quality of the foci, independently of the focal depth present.

For example, the means for adapting may comprise a wavefront manipulator comprising one or more optical components configured to adjust a wavefront of a component beam of the plurality of component beams based at least in part on the focal depth. For example, the wavefront manipulator may be configured to adapt at least one of a phase, an amplitude, or a polarization of one or more portions of a component beam of the plurality of component beams to adapt the wavefronts of the component beams based at least in part on the focal depth.

It should be mentioned that the focusing means (e.g., a focusing unit or a lens) can usually be designed for a defined focus quality for a predetermined compensated focal depth of the component beams within the material; by way of example, the focusing means can supply perfectly spherically foci or else, for example, foci with a predetermined astigmatism. However, as soon as there is a deviation of the present focal depth of the component beams from the predetermined compensated focal depth, there may be a focal depth-dependent change in the focus quality (e.g., a deviation from perfectly spherical foci or the predetermined astigmatism). Thus, the defined focus quality would no longer be provided in this case. Thus, focusing at different focal depths would be possible without a wavefront adaptation (for example, like in the case of conventional focusing systems), but the focus quality would vary over different focal depths in this case or would have a focal depth-dependent change in the focus quality. However, the device according to the invention can enable a desired, predetermined focus quality to be obtained, independently of the focal depth selected in each case.

In an example, the adaptation means can be configured so that the given focus quality can be generated for a plurality of predetermined focal depths.

The means for adapting can also be configured to generate a second given focus quality for a second predetermined focal depth. By way of example, a different given focus quality can be obtained depending on the focal depth by way of an appropriate adjustment of the means for adapting. By way of example, the focus quality can be adjusted by way of the wavefront adaptation over a plurality of focal depths (e.g., over the entire depth or height of the material), with the result that, over the plurality of focal depths, the respective desired (e.g., same or different) focus quality can be (substantially) ensured there. The invention therefore also allows suitable focusing over a wide parameter space of the focal depth, independently of the optionally predetermined compensated focal depth. What can arise as a result is that a majority of the material (or the totality of the material) can be exposed to the same focus quality of the foci independently of the focal depth present. Consequently, the optical focus quality need not be restricted to a specific depth range of the material, with the result that reliable and reproducible three-dimensional applications can be made possible within the scope of generating the foci within the entire material. Consequently, the invention can be used as a reliable three-dimensional focus generator.

By way of example, the deviation of the focus quality in relation to the desired (given) focus quality at different focal depths may also be referred to as a focal depth-dependent aberration. In this case, the invention can allow the aberrations to be compensated for, for example significantly (for example, also completely), by way of the adaptation of the wavefronts. By way of example, the adaptation means can be automatically adjusted by the device so that, for the predetermined focal depth, the aberration that would occur there without the adaptation means is substantially compensated for. Here, the compensation can also be referred to as a pre-compensation.

In an example, the given (first and/or second) focus quality can be based at least partially on a target state of the wavefronts at the focal depth. By way of example, the adaptation means can be configured so that the wavefronts are adapted with the result that the target state of a wavefront of a component beam is induced at the focus within the material. By way of example, the given focus quality may correspond to the target state of the wavefront of a component beam. Further, the adaptation means can be configured so that, for example, the target state of the wavefronts is approximately achieved (or with a small deviation, as described herein). By way of example, the target state of the wavefronts at the focal depth may comprise a defined spherical wavefront and/or a defined astigmatic wavefront. In a further example, the target state may correspond to any definable wavefront. The target state of the wavefront (e.g., for or at a location in the material) can be implemented, for example, by way of a definition of a wavefront described by way of a Zernike function or Zernike fringe function, which has corresponding Zernike polynomials or Zernike fringe polynomials.

By way of example, it is conceivable that, in the case of a spherical wavefront, the corresponding target state is defined by way of a Zernike fringe polynomial of an order comprising at least a quadratic order (e.g., the 4th, 9th, 16th, 25th and/or 36th order of the Zernike fringe polynomials). In this case, an order of the Zernike fringe polynomials may correspond to the known enumeration according to the fringe convention. Further, any other combination of Zernike fringe polynomials of different orders which cause an associated focus are conceivable for the definition of the target wavefront. In the case of a spherical target wavefront, a point spread function (of the optical system of the device) may for example be allowed to be rotationally symmetric in the material so that the energy (and/or the power) of the component beams over the foci can be concentrated on a minimal volume in the material. By way of example, this may be advantageous for an application within the scope of multiphoton polymerization.

By way of example, in the case of an astigmatic wavefront, it may be conceivable for the corresponding target state to be defined by way of a Zernike fringe polynomial of an order comprising at least the 5th and/or 6th order, wherein the astigmatic wavefront additionally may also comprise a Zernike fringe polynomial of the 4th order, for example. Further, any combination of Zernike fringe polynomials of different orders which result in an astigmatic wavefront are conceivable for the definition of the target wavefront. In the case of an astigmatic wavefront, the point spread function can be allowed to be elliptical such that the energy (and/or the power) of the component beams is induced asymmetrically into the material in the region of the foci. By way of example, this may be helpful for material processing (e.g., a repair of a lithography mask). The given focus quality which is induced in the astigmatic wavefront can also be such that, for example, the focus of a component beam has no rotational symmetry (e.g., the focus can have an elliptical design, be elongated along a defined axis and/or be tilted in a targeted manner with respect to an axis, with further corresponding shapes being conceivable).

Further, it is emphasized once again that the target wavefront may also differ for different predetermined focal depths. By way of example, a first target wavefront with a first (e.g., astigmatic) property as given focus quality can be generated by way of the device at a first focal depth, wherein the first property may be defined, for example, by way of a first set of Zernike fringe polynomials. In this case, a second target wavefront with a second (e.g., likewise astigmatic) property as given focus quality can be generated at a second focal depth, wherein the second property may be defined, for example, by way of a second set of Zernike fringe polynomials. In this case, the first and second set need not necessarily differ in terms of the order of the polynomials, but may also be defined by way of different characteristics or coefficients of the polynomials. Thus, by way of the wavefront adaptation, desired focus qualities can be generated by way of the device at different depths in the material. The device therefore need not necessarily be configured so that a constant focus quality can be generated independently of depth (although, naturally, this is possible). Rather, any desired given focus quality can be generated independently of depth.

In an example, the given focus quality can be based at least partially on a target state of the wavefronts in a plane of the device, which corresponds to a transformation of the target state of the wavefronts at the (predetermined) focal depth. By way of example, the target state of a wavefront of a component beam can initially be defined at the predetermined focal depth in the material. By way of a simulation and/or a back-calculation which takes account of the set-up of the device or of parts of the device, the state of the focusing means and of the adaptation means and/or the material, the state of the wavefront of the component beam or of the photon beam required to this end can be back-calculated in any plane of the device. This calculated state may correspond to a transformed target state of a wavefront in a plane of the device which is associated with the target state at the focal depth. Thus, if the transformed target state is obtained within the device, it is possible to ensure that the corresponding target state is generated at the focal depth. By way of example, the adaptation means can thus be configured so that it generates the transformed target state of the wavefronts.

In an example, the given focus quality can comprise a comparison measure of the target state of the wavefronts at the focal depth and/or target state of the wavefronts in the plane of the apparatus with respect to a corresponding actual state of the wavefronts. By way of example, the device may comprise a means for determining the actual state of the wavefronts. The determination means may comprise a detector, for example, which is arranged in a plane of the device for which a transformed target state was calculated. Thus, the detector can detect or measure the actual state of the wavefront in the plane. For example, the means for determining the actual state may be located in the vicinity of a (conjugate) pupil and/or in a (conjugate) pupil. In this case, the actual state at the detector may correspond to a transformed actual state, which is associated with the actual state at the focal depth. In this case, there can be a comparison of the transformed actual state with the corresponding transformed target state for the purpose of determining the comparison measure. Further, the transformed actual state can also be transformed into the actual state at the focal depth, in order to be able to be directly compared to the target state at the focal depth. In this case, the comparison measure may comprise, for example, a root mean square (RMS) wavefront error of the target state in relation to the corresponding actual state (as described herein).

In an example, the comparison measure may comprise an RMS wavefront error of the actual state at the focal depth with respect to the target state at the focal depth of less than 500 m$\lambda$, preferably less than 200 m$\lambda$, more preferably less than 100 m$\lambda$, most preferably less than 50 m$\lambda$. In a further example, the RMS wavefront error of the wavefronts in relation to predetermined target state is less than 40 m$\lambda$, preferably less than 30 m$\lambda$, more preferably less than 10 m$\lambda$, most preferably less than 5 m$\lambda$. The RMS wavefront error can be quantified by way of the square root of the normalized sum of the squares of the deviation of the wavefront of the actual state from the wavefront of the target state. In this case, this RMS aberration of the wavefront can be specified as a fraction of the used wavelength $\lambda$ of the component beam (or of the photon beam). Accordingly, 1 m$\lambda$ (i.e., one milli-lambda) corresponds to one thousandth of the wavelength of the used photon beam. The given focus quality may therefore also be defined by virtue of the values of the comparison measure mentioned herein being fulfilled within the scope of focusing. For example, the values for the RMS wavefront error may be ensured over a focal depth range of at least 3 mm, at least 5 mm, at least 10 mm or at least 15 mm.

In an example, the device may comprise a means for determining the actual state of the wavefronts, preferably the actual state in a plane of the device and/or at the predetermined focal depth, and a means for controlling the adaptation means on the basis of a deviation of the determined actual state with respect to the corresponding target state. The controlling means may comprise any loop controller which, for example, is coupled to the determination means and the adaptation means. Here, the control by means of the controlling means may be based on a closed and/or open control loop. On the basis of the comparison of the target state with the actual state, it is possible to accordingly deform the wavefronts by means of the adaptation means, with the result that the deviation is reduced or minimized. By way of example, the target state may be stored in a database which is comprised by the device, by the controlling means and/or by another piece of equipment, or may emerge from a correspondingly stored function. The deviation can be quantified as RMS wavefront error (as described herein). What can be achieved in an application, for example in an ideal case, is that the actual state (substantially) corresponds to the target state after the wavefront adaptation. In another example, the control can ensure that the values of the RMS wavefront error mentioned herein are satisfied during focusing, with the result that a sufficient focus quality is consequently ensured, By way of example, for the control, the determination means can detect the wavefronts in a plane upstream of the focusing means such that the wavefronts are detected in a plane without being exposed to further optical elements before they are input coupled into the focusing means (e.g., the lens). By way of example, this can minimize the influences of the optical elements that are not part of the focusing means in the control. Such influences include, for example, shape and position tolerances of these optical elements.

In an example, the adaptation means can be configured so that the wavefronts are adapted such that the wavefronts are deformed or curved to generate the given focus quality. By way of example, the curvature of the wavefronts in this case can be based at least partially on the focal depth of the component beams (wherein, for example, the focal depth may be substantially the same for all component beams). The curvature may comprise, for example, a local portion of the wavefront, with a global curvature (e.g., with a global radius of curvature, that is to say spherical curvature) also being conceivable. Further, the curvature may also comprise any rotationally symmetric curvature or an astigmatic curvature. In the process, the adaptation means may influence the component beams substantially in the same way. The inventors have recognized that the focus quality, which is present in the case of a focused component beam for example, can be generated by way of a defined deformation or curvature of the wavefront of the component beam. The idea of the inventors in this case comprises causing a targeted optical path difference for the component beams. In this case, a component beam may comprise, for example, a plurality of component rays (e.g., further component rays may be comprised in addition to the chief ray and the marginal rays). By way of the (local) curvature or deformation of a wavefront of a component beam, it is possible in this case to cause different optical path differences in relation to a reference plane (e.g., a pupil of the focusing means) for different component rays of the component beam. If the component beam is now input coupled into the focusing means with a defined optical path difference, then this defined optical path difference also causes a change in the phase within the material (in relation to the phase of the component rays without the presence of a wavefront adaptation), even for the component rays of the component beam. The focus quality for a component beam can be generated by way of this phase change of the component rays (with the component rays converging at the focus of the component beam). The optical path difference of the wavefront can be implemented here for one or more component beams, with the result that the given focus quality can be generated accordingly for the one or more component beams.

The (optionally locally different) curvature or deformation of the wavefronts intended to be implemented in relation to a present focal depth of the component beams may be for example predetermined (or else stored) in the process. In the process, the curvature or deformation of the wavefronts may be described, for example, by way of a function which comprises a relationship of the focal depth of the component beams with respect to the curvature. By way of example, the curvature characteristic of the wavefronts may also be stored in a database which comprises a focal depth of the component beams and the corresponding wavefront deformation as parameters. It should be mentioned that curvature or deformation of the wavefronts can be described, for example, by way of a radial variable and/or an angular variable (e.g., for the suitable definition of the target state of the wavefronts).

In an example, the adaptation means can be configured so that the curved wavefronts have an axis of symmetry. Accordingly, the curvature need not necessarily adopt a complex (e.g., asymmetric) curved profile of the wavefront. In an example, the axis of symmetry in this context comprises the chief ray of the respective component beam whose wavefront is curved. In a further example, the adaptation means can be configured so that the curvature of the wavefront is based at least partially on a (radial) distance of a component ray of the component beam from the chief ray of the component beam. The curve profile of the curvature of the wavefront may in this case comprise, for example as abscissa, the distance of a component ray from the chief ray of the component beam, with the optical path difference per component ray being able to be plotted on the ordinate.

In an example, the adaptation means can be configured to adapt the wavefronts based at least in part on a refractive index difference experienced by the focused component beams. By way of example, the curvature of the wavefronts in this case may extend in a manner based (at least partially) on the refractive index difference. The refractive index difference may comprise a refractive index difference which is not necessarily associated with a refractive index of an optical component of the device, but instead is associated with a refractive index of the material and its surround, which the component beams, for example, experience upon entrance into the material.

In an example, the refractive index difference can be caused by a refractive index of a medium adjoining the material and a refractive index of the material. By way of example, the medium may directly adjoin the material, with the result that the component beams, after passing through the focusing means, initially pass through the medium (with, for example, a first refractive index) and subsequently are refracted into the material (with, for example, a second refractive index). Consequently, at different focal depths, the component rays of the component beams may run through the material over different geometric distances in this case, with a geometric distance arising between the entrance point of the component ray into the material and the focus. Accordingly, the component rays of the component beams may have different optical path differences at different focal depths, which may cause a focal depth-dependent change in the focus quality of the component beams. In this case, the inventors have recognized that this refractive index difference (e.g., between the first and the second refractive indices) can be taken into account in the context of the curvature of the wavefronts (e.g., by way of suitably controlling the adaptation means), for example in order to generate the given focus quality. In this case, it is not necessarily the difference between the refractive indices that needs to be taken into account; instead, the values of the refractive indices can be introduced into the curve profile of the wavefronts, for example in the form of a ratio of the refractive indices to one another, etc.

In an example, the given focus quality can be chosen in such a way that a spherical aberration of the focused component beams is minimized.

In an example, the adaptation means can be configured in such a way that it adapts the wavefront of the photon beam in order to adapt the wavefronts of the component beams. By way of example, the adaptation means can be arranged in the device in such a way that it adapts the wavefront of the photon beam (and, for example, not directly the wavefronts of the component beams, although this would also be possible). If the adapted photon bean is subsequently split into the plurality of component beams via the splitting means, it is however possible in one example to assume that the adapted wavefront of the photon beam substantially corresponds to the properties of the wavefronts of the component beams. Accordingly, there can be an (indirect) adaptation of the wavefronts of the component beams by way of adapting the wavefront of the photon beam. By way of example, to this end, the splitting means can be configured so that it transfers the characteristic of the wavefront of the photon beam to the characteristic of the wavefronts of the plurality of component beams without a significant deviation arising.

In an example, the splitting means can be configured so that at least two component beams have substantially the same energy and/or substantially the same power. For parallel focusing of the component beams within the material, it may for example be helpful that the foci also have substantially the same characteristic in relation to the energy and/or the power of the component beams. Consequently, it is possible to ensure by way of the invention that not only can the foci (generable in parallel) be similar in relation to the target state of the wavefront but also that the optical properties in relation to energy/power are (substantially) similar for at least two foci of the component beams. By way of example, a plurality of foci that are substantially indistinguishable in terms of the optical properties can thus be generated (in parallel or simultaneously) within the material. By way of example, this may be advantageous for a local material modification by way of the foci since the local material modification may depend on the energy/power of the component beams, with the result that, by way of this example, parallel processing of at least two foci can be made possible without a substantial difference being present in the final result of the material modification. In an example, the splitting means can be configured so that at least three, preferably at least four, more preferably at least five, most preferably at least ten component beams comprise the same energy and/or power. It should be noted here that, for example, all component beams may comprise the same energy and/or power, with it also being conceivable that only a predetermined subset of the component beams comprises the same energy and/or power and that further component beams, however, comprise a significantly lower and/or a substantially negligible energy and/or power.

In an example, the splitting means can split the photon beam into a plurality of component beams by way of a diffraction of the photon beam and/or by way of a local phase modulation of the photon beam. By way of example, the splitting means may comprise a diffraction grating in order to split the photon beam into a plurality of component beams by way of diffraction, By way of example, the diffraction grating may comprise a transmission grating and/or reflection grating, with further optical gratings also being conceivable. The component beams may correspond to the orders of diffraction of the photon beam if a diffraction grating is used. In an example, the splitting means may also comprise an adaptive optical unit, a deformable (e.g., adaptive) mirror and/or a spatial light modulator (SLM) for splitting the local phase modulation of the photon beam into a plurality of component beams. The spatial light modulator (SLM) may comprise, for example, a liquid crystal SLM (e.g., a liquid crystal on silicon (LCoS) SLM). However, further phase modulators which are able to locally change the phase of the photon beam at a plurality of locations so that the photon beam is split into a plurality of component beams are also conceivable.

By way of example, the splitting means can be configured to generate the component beam in a plane (2-D). However, it may also be configured to generate component beams arranged in three dimensions with respect to one another.

In an example, the splitting means can comprise the adaptation means, with the adaptation means being able to be configured to adapt the photon beam such that the latter is split into the plurality of component beams at the same time. By way of example, the splitting means and the adaptation means can therefore be implemented by way of the same optical element of the device, which for example can be understood to be a splitting and adaptation means. The splitting and adaptation means can therefore receive the photon beam, split the latter into the plurality of component beams and adapt the wavefronts thereof (as described herein). By way of example, the splitting and adaptation means can comprise an adaptive optical unit, for example a spatial light modulator (SLM).

In an example, the splitting means can be configured to cause a predetermined geometric distribution of the foci of the component beams in the material. By way of example, the geometric distribution may comprise any spatial arrangement of the foci of the component beams with respect to one another. For example, the foci may be arranged in a rectangular pattern, a triangular pattern, a circular and/or elliptical pattern, with any degree of configuration of the arrangements being conceivable. By way of example, the splitting means may cause the arrangement of the foci with respect to one another by way of diffraction (or its diffraction characteristic). Further, the splitting means may also cause the arrangement of the foci with respect to one another by way of the local phase modulation of the photon beam.

In an example, the splitting means can be arranged in a surround of a pupil and/or in a surround of a conjugate pupil of the focusing means in the device, in such a way that the component beams are substantially encompassed in the diameter of the pupil of the focusing means. In an example, the wavefronts of the component beams can be incident into the pupil in such a way that the wavefronts of the component beams are not (substantially) offset from one another. In particular, the pupil in this case may denote the pupil of a lens, which is part of the focusing mean s.

In this case, a pupil of the focusing means can be understood to be a stop of the focusing means, wherein a conjugate pupil of the focusing means can be understood to be an image of this stop. In this case, a stop can be understood to mean a defined boundary of the aperture of the photon radiation along a plane, which is caused, for example, by the beam path and/or a bounding element. In this case, the boundary can be substantially independent of the deflection of the photon radiation in the optical system of the device; for example, the assumption can be made that the photon radiation passes completely through the diameter of the pupil during the operation of the device (also, for example, when optical components of the device, for example optical components of the focusing means, are displaced). In this case, a pupil of the focusing means can be optically accessible, that is to say an optical element can be introduced into the pupil so that the rays can be adapted in the pupil. However, a pupil of the focusing means may also be optically inaccessible, that is to say the pupil may be located within an optical element (e.g., a lens element or a lens). In this case, one or more conjugate pupils of the pupil of the focusing means may be present within the device, wherein the photon radiation also passes completely through the diameter of the conjugate pupil (as the image of the pupil) during the operation of the device (e.g., independently of the deflection of the photon radiation). The (conjugate) pupil of the focusing means can therefore also be understood as, in principle, a pupil of the device.

It should be mentioned that a (conjugate) pupil of the device can also be understood in the sense that the chief rays of the photon radiation intersect in the center of the (conjugate) pupil (i.e., the diameter of the photon radiation is substantially completely within the pupil independently of the angle of incidence of photon radiation into a (conjugate) pupil). Thus, the functionality of the device can usually be designed in relation to the interaction of the photon radiation with the pupil. This functional design of the device can be taken into account when generating the component beams. In this case, the inventors have recognized that the interaction of the component beams with the pupil can be improved if the splitting means is arranged in a surround of the pupil and/or a conjugate pupil. For example, the surround can be considered to be close to a (conjugate) pupil as soon as it is possible for a significant portion of the component beam to be introduced within the pupil of the focusing means, as a result of which the optical quality of the foci can be ensured. By way of example, the surround may comprise causing at least 70%, preferably at least 90%, more preferably at least 98%, most preferably at least 99% of the component beam to be located completely within the diameter of the pupil of the focusing means. By way of example, the splitting means may in this case also be arranged directly in the pupil and/or conjugate pupil should the (conjugate) pupil be accessible. Further, it should be mentioned that (conjugate) pupils can be generated in a targeted fashion (e.g., by way of Kepler systems) by way of the optical set-up, the splitting means (or other components described herein), for example, being able to be arranged in the said (conjugate) pupils.

In an example, the surround is designed (or the splitting means is arranged) so that an intersection of a chief ray of a component beam with a plane of the pupil (of the focusing means) includes a distance from the center of the pupil of no more than 10% of the diameter, preferably no more than 1% of the diameter, most preferably no more than 0.1% of the diameter of the pupil. Accordingly, the incidence of the component beam into the pupil of the focusing means can be improved by way of such an arrangement of the splitting means in the surround of the (conjugate) pupil. Consequently, the incidence of the component beam may comprise a small deviation in relation to the incidence of the photon radiation into the pupil of the focusing means. It should be mentioned that, for example in the case of a direct arrangement of the splitting means in a (conjugate) pupil, the assumption could be made that the chief rays of the component beam intersect the center of the pupil of the focusing means. This would be technically advantageous but this may sometimes not be implementable due to the technical requirements of the device, with the invention making use of the fact that it may be sufficient to position the splitting means sufficiently close to the (conjugate) pupil so that the boundary conditions, mentioned herein, for the intersection of the chief ray of the component beam with the plane of the pupil are satisfied. Thus, according to the invention, it is possible to ensure that the pupil of the focusing means in relation to the photon radiation also substantially corresponds to the pupil in relation to the component beam. It should be mentioned that the boundary conditions (described herein) for the distance of the intersection of the chief ray of the component beam with the plane of the pupil may also be fulfilled for a plurality of component beams, preferably for all component beams.

In an example, the surround is designed so that the intersections of the chief rays of at least two component beams with the plane of the pupil are arranged within a diameter including no more than 10% of the diameter of the pupil, preferably no more than 1% of the diameter of the pupil, most preferably no more than 0.1% of the diameter of the pupil. In some examples, the intersections of the chief rays of more than two component beams (or even of all component beams, or of the component beams with substantially the same power/energy) may be arranged within such a diameter. Thus, for the device, the incidence of the component beams into the pupil of the focusing means need not necessarily be described by way of the center of the pupil. An incidence of the chief rays at approximately the same position in the plane of the pupil can ensure that these are incident on the material at the same angle.

It should further be mentioned that in an example the adaptation means may likewise be arranged in a surround of (or in) the pupil and/or conjugate pupil of the focusing means (e.g., even if the splitting means does not comprise the adaptation means). Consequently, it is possible to ensure that all rays that run through one point of the adaptation means are also substantially incident on a common point in the plane of the pupil of the focusing means (e.g., independently of the deflection of the photon beam or the spatial separation of the component beams). Consequently, it is possible to ensure the optical quality of the foci within the material. By way of example, what is consequently possible to be achieved is that the adaptation of the component rays of the component beams may occur substantially equally, with the result that the adaptation of the wavefronts of the component beams likewise occurs substantially uniformly, as a result of which the optical quality can be reliably implemented for each focus of the component beams.

In an example, the focusing means can be configured so that the given focus quality can be generated without an adaptation of the wavefronts for a predetermined compensated focal depth and for wavefronts incident in substantially planar fashion on the focusing means. Thus, the focusing means can be designed for a specific focal depth, at which the given focus quality of the photon radiation and/or component beams is present without needing to resort to the adaptation means (as described herein). By way of example, the target state of the wavefronts can thus be present at the predetermined compensated focal depth without wavefront adaptation. The predetermined compensated focal depth may be based on, for example, the wavelength-dependent refractive index of the material and the refractive index of the medium surrounding the material. It should be mentioned that, for focal depths that deviate from the predetermined compensated focal depth, the adaptation of the wavefront as described herein can be carried out according to the invention, with it also being conceivable that the adaptation can likewise be implemented for the predetermined compensated focal depth. It should also be mentioned that the device can be configured so that the foci of the component beams are arranged at exactly one focal depth, that is to say at exactly one depth plane of the material. In this case, the given focus quality can be substantially the same for the foci at the predetermined compensated focal depth.

In an example, the device can be configured so that the focal depth is adjusted by displacing the focusing means and/or by displacing the material. By way of example, the displacement can be implemented along the optical axis, with the result that the focus or the foci within the material are likewise displaced along the optical axis (or in the direction of the optical axis) in return. In an application, only the focusing means can be displaced in the process. However, it is also conceivable that only the material is displaced along the optical axis or that both components, that is to say the displacement means and the material, are displaced in order to set the focal depth in the material.

By way of example, the focusing means can be configured so that the chief rays of the component beams are incident perpendicular to a surface plane of the material. The focusing means may comprise a lens which is telecentric on the material side.

By way of example, the device can also be configured so that the focal depth is further adjusted by way of the adaptation means. Consequently, the focal depth can be set by way of displacing the focusing means and/or the material and, additionally, can be finely adjusted, for example, by way of the adaptation of the wavefronts (e.g., by way of a suitable curvature of the wavefronts). Further, an application is also conceivable, within the scope of which the focal depth can be variably adjusted exclusively by way of the adaptation means (e.g., without displacing the focusing means or the material).

In an example, the device comprises a means for laterally deflecting the focused component beams in a focal depth plane formed by the foci of the component beams (wherein the means for laterally deflecting can also be termed lateral deflection means). By way of example, the lateral deflection means can comprise a deflection unit, which is able to deflect the component beams in such a way that the foci of the component beams can be laterally offset (e.g., up to a certain degree) within the focal depth (i.e., along the focal plane) within the material. This can enable lateral play in relation to the optical axis for the positioning of the foci, without for example having to laterally offset the material or having to spatially tilt or displace the focusing means to this end. The means for laterally deflecting may, for example, comprise a pivotable mirror. By way of example, the lateral deflection means can be configured to deflect the photon beam or tilt the beam path of the photon beam in relation to the optical axis, which in return may cause a corresponding deflection (or a tilt) of the component beams. The angles at which the component beams are now incident into the pupil of the focusing means can consequently be designed to be variable by way of the deflection of the photon beam, with the result that a corresponding lateral offset of the foci of the component beams in the material may be caused. Further, it is also conceivable that the lateral deflection means (e.g., the deflection unit) receives the component beams directly, and additionally deflects these for a corresponding lateral offset.

By way of example, the device can be configured so that the given focus quality (e.g., within the RMS wavefront error described herein) is also obtained for laterally deflected foci. By way of example, these can be obtained with a deviation of less than 500 m, preferably less than 200 mλ, more preferably less than 100 mλ, most preferably less than 50 mλ over a lateral deflection with an absolute value of at least 20 μm, at least 50 μm or even at least 100 μm. In some examples, the RMS wavefront error is less than 10 mλ, or even less than 5 mλ, at least within a lateral deflection of up to 10 μm, 20 μm or 50 μm. For example, these values may be obtained over a focal depth range of at least 3 mm, at least 5 mm, at least 10 mm or at least 15 mm.

In an example, the lateral deflection means can (also) comprise the splitting means and/or the adaptation means. In an example, the splitting means for example may be configured to be pivotable in the process, with the result that the component beams can be tilted (simultaneously) in relation to the optical axis. Consequently, the angles of incidence of the component beams into the focusing means can be designed to be variable, with the result that it is possible to cause a lateral offset of the foci within the material. Further, it is also conceivable for the adaptation means to be configured to be pivotable in order to design the angles of incidence of the component beams into the focusing means to be variable in the same way, with the result that it is possible to cause a lateral offset of the foci within the material. In an example, the adaptation means can also design the angles of incidence of the component beams into the focusing means to be variable without pivoting/tilting (e.g., by way of a spatial phase modulation of the component beams or photon beam; for example, the adaptation means can be designed as a spatial light modulator, SLM, in this case).

In an example, the lateral deflection means can be arranged in a surround of (or in) the pupil and/or conjugate pupil of the focusing means. Consequently, it is possible to ensure that all rays that nm through one point of the lateral deflection means are also substantially incident on a common point in the pupil plane of the focusing means (e.g., independently of the deflection of the photon beam or the spatial separation of the component beams). Consequently, it is possible to ensure the optical quality of the foci within the material (independently of the lateral deflection).

In an example, the device can be configured so that the component beams (or the photon beam) are focused into a lithography mask. By way of example, the device can be suitable for receiving a mask and the material may comprise the mask material. In this context, the device can be designed, in particular, as a mask repair or mask correction device.

In another example, the device can be configured so that the component beams (or the photon beam) are focused into a photopolymer, with the photopolymer representing the material. The component beams can be focused into the (e.g., liquid or solid) photopolymer by use of for example suitable focus parameters (e.g., as described herein), with the result that a multiphoton polymerization of the photopolymer is caused.

In another example, the device can be configured so that the component beams (or the photon beam) are focused into glass, which represents the material. Thus, in this case the device may serve to process a glass. The component beams can be focused into the glass by use of for example suitable focus parameters (e.g., as described herein), with the result that a drilled hole is caused in the glass. Further, focusing into the glass can also be implemented so that the glass is cut. Further, focusing into the glass can be implemented in such a way that the glass is structured (or can be structured), for example for generating a microfluidic structure in the glass. For example, channels through which liquids can be guided can be generated in the glass by way of the focusing.

A second aspect relates to a method for focusing a photon beam into a material, comprising: directing a photon beam at a means for splitting the photon beam such that the photon beam is split into a plurality of component beams; focusing the component beams (e.g., using a means for focusing) within the material, with the component beams being focused at a predetermined focal depth within the material; and adapting the wavefronts of the component beams (e.g., using a means for adapting) based at least in part on the focal depth.

For example, the method can be carried out using a device according to the first aspect.

In an example of the method, the wavefronts can be adapted so as to generate a given focus quality of the foci of the component beams at the predetermined focal depth.

A third aspect relates to a method for determining a target state of a wavefront, comprising: simulating a course of a photon beam (and/or at least a component beam) by way of a simulation set-up which is at least based on a means for focusing the device of the first aspect and a simulated material. Further, the simulation set-up may also comprise further simulated components and/or optical elements of the device. Further, the method comprises defining a target state of a wavefront of the photon beam and/or of at least one component beam at a predetermined focal depth within the simulated material and transforming the target state of the wavefront at the focal depth into a corresponding target state of the wavefront in a plane of the simulated device.

The corresponding target state in the plane can subsequently be transmitted to the device of the first aspect, a means of the device of the first aspect and/or a computer. Accordingly, the target state can be received by the receivers and used for the operation of the device as described herein (e.g., for controlling the actual state based on a deviation from the target state).

The simulation may, for example, be based on a finite-element-method simulation. For example, parts of the device of the first aspect may be constructed as geometries within the simulation. Said parts may suffice to achieve simulation results that enable to determine the corresponding target state of the wavefront for a particular device. In the field various approaches for simulating optical devices are known, which may be used for this aspect. For example, the means for focusing (e.g., a focusing unit and/or an objective of the device) may be constructed as one or more geometries in the simulation having certain optical effects on a particular ray of a photon beam going through the means for focusing. Furthermore, the material into which the photon beam is focused may also be constructed as a geometry within the simulation. The simulated material may be constructed such that it may have a certain refractive index which may adapt various rays of the photon beams that will enter the material during the simulation. Also, the simulation may comprise a light source as a starting point for the rays of the photon beam.

For example, the method of the third aspect may comprise as a first step constructing one or more geometries that correspond to the means for focusing of the device of the first aspect. Also, further parts of the device of the first aspect may be constructed as geometries within the simulation (as described herein). For example, a simulation-setup of the device of the first aspect may be constructed via one or more geometries in the first step. In a second step one or more geometries that correspond to the material into which the photon beam is focused by the constructed simulation-setup may be constructed. Subsequently, in a third step a light source for a photon beam may be defined within the simulation, that function as the source for the rays of the photon beam within the simulation. In a fourth step a simulation of the photon beam having one or more rays may be performed wherein the photon beam goes through the constructed simulation-setup such that it is focused within the simulated material at a predetermined focusing depth. The geometries of the simulation-setup may be adapted to reach the predetermined focusing depth at a defined target state (e.g., with a certain optical quality). For example, within the simulation a certain target state of the wavefront of the photon beam may be chosen at the predetermined focal depth within the simulated material. In a fifth step the simulation may be fixed at this defined target state of the wavefront at the predetermined focal depth. Subsequently, the photon beam may be analyzed at various (optical) planes within the simulation-setup. For example, a specific plane may correspond to an easily accessible plane within the device (e.g., where a sensor may be easily positioned). For said specific plane the optical quality (e.g., a state of the wavefront) of the photon beam may be determined wherein the wavefront at the predetermined focal depth is still fixed at the defined target state. Hence, a correspondence between the defined target state of the wavefront at the predetermined focal depth and the specific plane may be given by the simulation. The optical quality of the photon beam at said specific plane may thus be regarded as the corresponding target state of the wavefront. Hence, having information on the corresponding target state at the specific plane enables to know the state of the wavefront at the predetermined focal depth. The simulation results may thus be used to determine the state of the wavefront at the predetermined focal depth at a real device based on a determination of a wavefront state at a more easily accessible plane within the device.

Notably, every aspect described for the first or second aspect may be implemented in the simulation of the third aspect as well. For example, a means for splitting (as described herein) may be constructed within the simulation-setup. In such a case, a target state of a specific component beam at the predetermined focal depth may be implemented during the simulation (e.g., by adapting simulation parameters, e.g., the simulated geometries or ray characteristics). As described for the simulation for a single photon beam, the target state of the specific component beam may be held constant at the predetermined focusing depth. Subsequently, at an (optical) plane within the simulated device the wavefront of the component beam may be determined. Said wavefront may be regarded as the corresponding target wavefront which is present at said (optical) plane when the component beam is at its target state within the material. Hence, having information on the corresponding target state of the component beam at said (optical) plane enables to know the state of the wavefront of the component beam at the predetermined focal depth.

A fourth aspect relates to a computer program comprising instructions which, when executed by a device according to the first aspect and/or by a computer, cause the device and/or the computer to carry out a method according to the second aspect and/or third aspect.

Alternatively or additionally, the computer program may include instructions to carry out the further method steps described herein or to carry out or implement the functionality of the devices described herein. By way of example, the computer program may cause certain optical elements (or means) of the device to be displaced and/or activated such that a focal depth selected in the program arises (automatically) in the material. Thus, the device can be controlled on the basis of a computer program and an interface to the optical elements (or means) of the device. By way of example, the computer program may comprise a computer program which implements a control loop for controlling the adaptation means (e.g., a closed control loop).

A further aspect relates to a device for processing a lithography object using a photon beam, comprising: means for splitting the photon beam into a plurality of component beams; and means for focusing the component beams. The device may be configured in such a way in the process that the component beams are focused within the object in such a way that the object is modified in the region of the foci of the component beams. The device of this further aspect may be designed like the device of the first aspect wherein the device of the further aspect may not necessarily comprise a means for adapting the wavefront. In this case, the lithography object may comprise a lithography mask. Accordingly, the device can also act as a mask repair or mask correction device.

A further aspect relates to the devices described herein, having a memory which comprises a computer program for at least partial automated control of the device. Further, the device of an aspect may have a means for executing the computer program. Alternatively, it is possible for the computer program to be stored elsewhere (e.g., in a cloud) and for the apparatus to merely have means for receiving instructions that arise from executing the program elsewhere. Either way, this may allow the method to run in automated or autonomous fashion within the system and/or device. Consequently, it is possible to minimize the intervention via a manual measure, for example, with the result that the complexity during operation can be reduced.

The features (and also examples) of the method that are specified herein may also be applied or applicable correspondingly to the devices mentioned. The features (and also examples) of the devices that are specified herein may likewise also be applied or applicable correspondingly to the methods (and computer programs) described herein.

BRIEF DESCRIPTION OF DRAWINGS

The following detailed description describes technical background information and working examples of the invention with reference to the figures, which show the following:

FIG. 1B elucidates the beam path of the chief rays of three component beams.

DETAILED DESCRIPTION

Figures 1A, 1B:
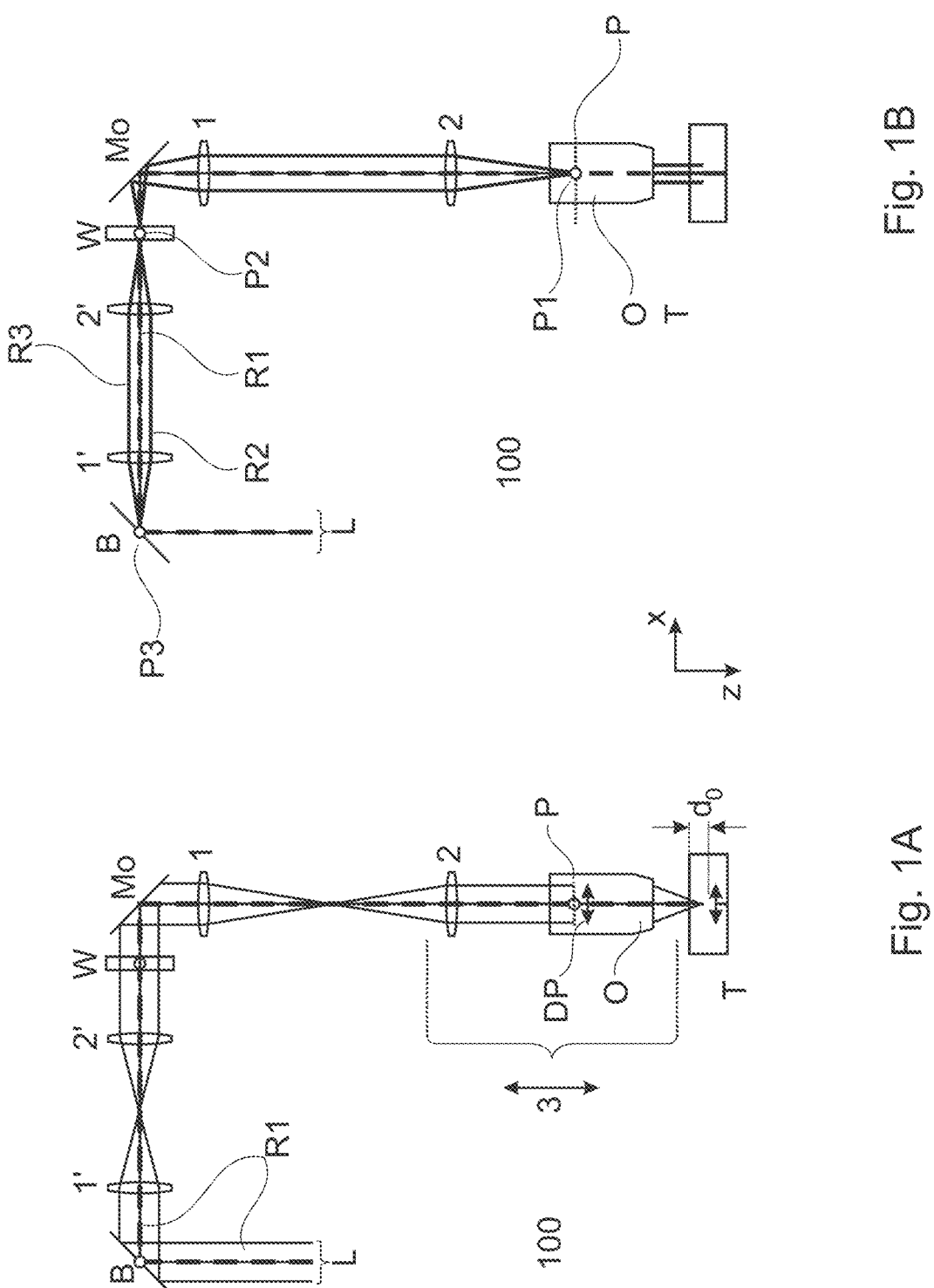
FIGS. 1A and 1B schematically elucidate a first exemplary device according to the invention in a side view. In this case, FIG. 1A elucidates the beam path of a beam of a photon beam.

FIGS. 1A and 1B schematically elucidate a first exemplary device 100 according to the invention in a side view. In this case, FIG. 1A elucidates the beam path of a beam of a photon beam L. FIG. 1B elucidates the beam path of the chief rays R1, R2, R3 of three component beams.

To explain the invention, reference can initially be made to the exemplary beam path in FIG. 1A. The device 100 may comprise a splitter B, which is able to split a photon beam L incident thereon into a plurality of component beams. Splitting the photon beam is not illustrated in FIG. 1A; all that is shown is the basic path of a photon beam through the device 100 for elucidation purposes. It can be tracked by way of the marked chief ray R1 and the two marginal rays of the photon beam L in FIG. 1A. Downstream of the splitter B, it can be gathered from the further beam path along the optical axis of the device 100 that the device 100 may comprise a first lens element system, which may include the lens element 1' and the lens element 2' and which may therefore form a first Kepler system. Further, the device 100 may comprise a wavefront manipulator W, which may be suitable for adapting the wavefront of the photon beam L on the basis of the focal depth. The wavefront manipulator W may in this case correspond to the means for adapting the wavefronts described herein. In FIG. 1A, the photon beam L is transmitted through the wavefront manipulator WV, for example, in the process. Following this, a folding mirror M0 may be arranged in the device 100, the said folding mirror only adapting the geometric path of the optical axis (e.g., in the device for spatial regions). Following this, a second lens system may be constructed, the latter comprising the lens element 1 and the lens element 2 and consequently being able to form a second Kepler system. An objective O is present in the further course along the optical axis. In this case, the objective O may comprise a pupil P in a pupil plane. In this case, the photon radiation incident on the lens can be focused within a material T by way of the components of the objective O. In FIG. 1A, the focal depth is specified schematically as focal depth d0. The lens element 2 and the objective O can be understood to be a focusing unit 3 in this case. In this case, the objective O or the focusing unit 3 may correspond to the means for focusing the wavefronts described herein.

Figure 13:
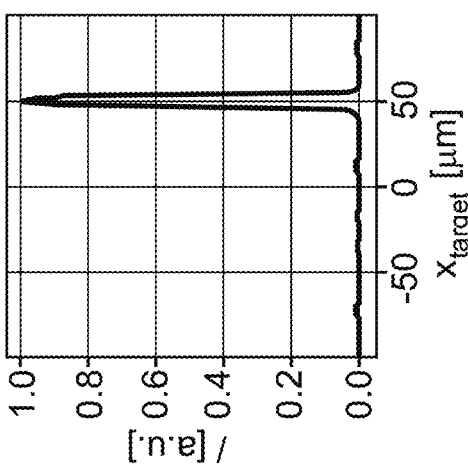
FIG. 13 qualitatively shows the phase distribution of the adaptation means of the third exemplary device, which causes a third arrangement of the foci, with the qualitative intensity distribution of the component beams within the material at the focal depth also being depicted. In this case, the foci comprise an astigmatism induced in a targeted manner, the orientation of which was aligned in a targeted manner.
Figure 13:
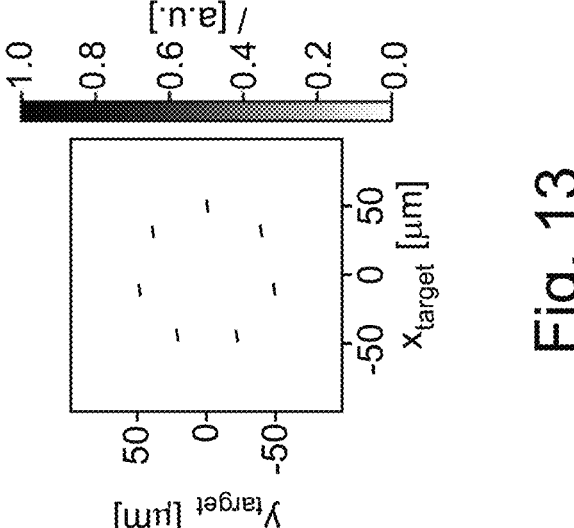
Figure 13:
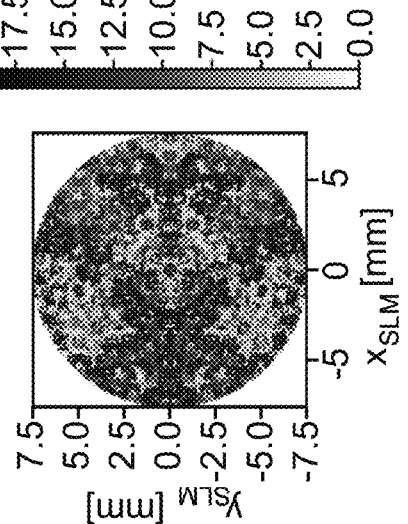

The concept of the invention can now be explained in more depth on the basis of FIG. 1B. In this case, FIG. 1B only depicts the path of the chief rays R1, R2, R3 of the component beams through the device 100. In this case, the chief ray of the photon radiation L incident on the splitter B can initially likewise be identified. The splitter B can split this photon beam L into a plurality of component beams, with an exemplary split into three component beams being depicted in FIG. 1B. The further path of the three component beams through the device 100 can be traced here by way of their chief rays R1, R2, R3. It should be observed that, in contrast to the use of one photon beam L. (for example, like in FIG. 1A), it is now three component beams that run substantially simultaneously through the device 100. Consequently, starting with one photon beam L, three foci of the component beams can be caused at the focal depth (e.g., at the focal depth d0) in the material T in this case. In this case, the foci of the component beams may be arranged along the plane of the focal depth and may have a defined lateral spatial offset from one another. In an example, the foci can be used for local material processing of the material, with a material modification being able to be induced in the region of the foci by way of suitable parameters of the photon beam or component beams. However, to ensure the optical quality of the foci within the material T, it is helpful to design the optical set-up of the device 100 in a targeted manner. In this case, the invention is based, inter alia, on suitable positioning of the components of the device 100 in relation to the pupils of the device 100. In this respect, the pupils P1, P2, P3 of the device are therefore marked in FIG. 1B. In this case, the device 100 may initially comprise a pupil P1 of the objective O (or of the focusing unit 3). In this case, the pupils P1, P2, P3 may (as described herein) comprise a point at which the chief rays of the photon radiation or the chief rays of the component beams (e.g., R1, R2, R3) intersect. In this case, the intersection can be independent of the deflection/tilt of the photon beam or component beams in relation to the optical axis, with the result that a pupil can also be understood to be a stop or an image of a stop. Accordingly, the optical design of the device 100 can be designed so that the chief rays R1, R2, R3 intersect at a point in the pupil of the objective O (e.g., the center of the pupil P3) during the operation of the device. As may be gathered from FIG. 11B, the chief rays R1, R2, R3 then continue to fall into the pupil plane at different angles of incidence, with the result that a lateral offset of the foci of the component beams can be caused within the material T by way of the objective O. In this case, the objective O can be designed to be telecentric such that the chief rays R1, R2, R3 are incident on the material T in a manner perpendicular to the material plane of the material T, as indicated in FIG. 13.

In order to enable the defined incidence of the chief rays R1, R2, R3 on the pupil plane (as described herein), the components of the device 100 must however be arranged in a defined manner along the optical axis. Firstly, the splitter B can be arranged in a conjugate plane P3 of the pupil P1 to this end, as indicated in FIG. 1B. Likewise, the wavefront manipulator W can be arranged in a conjugate plane P2 of the pupil P1 to this end. It should be mentioned that it may also be sufficient to arrange the splitter B and/or the wavefront manipulator W in a surround of a pupil of the device. In this disclosure, the phrase "surround of a pupil" refers to the surrounding space or region of a pupil, or a vicinity of a pupil. In this case, the splitter B and/or the wavefront manipulator W can be arranged sufficiently close to a pupil of the device 100 so that the chief rays R1, R2, R3 are likewise incident in the pupil P1 of the objective O in a manner close to one another or close to the center of the pupil P1. A boundary condition may be that the splitter B and/or the wavefront manipulator W must be arranged so close to a (conjugate) pupil that an intersection of a chief ray R1, R2, R3 with the pupil plane P has a distance from the center of the pupil P1 which is less than 10% of the pupil diameter DP. Preferably, the distance of the intersection of a chief ray R1, R2, R3 with the pupil plane from the center of the pupil Pt can be less than 100 of the pupil diameter DP, less than 1% of the pupil diameter DIP or less than 0.1% of the pupil diameter DP. In this case, the pupil diameter DP can be defined, for example, by way of the diameter of the aperture of the pupil P1. An alternative boundary condition can be that the intersections of two chief rays (e.g., R1 and R3) in the pupil plane P have a distance from one another of no more than 10% of the diameter of the pupil, preferably no more than 1% of the diameter of the pupil, most preferably no more than 0.1% of the diameter of the pupil. The diameter of the pupil can be 6 mm in an example. Independently of the specific diameter of the pupil, the distance of an intersection of a chief ray with the center of the pupil can preferably be no more than 600 µm, preferably no more than 60 µm, more preferably no more than 6 µm. The same may also apply to the distance(s) of the intersections of the chief rays from one another. However, it is also conceivable that the distance of the intersection of a chief ray of a component beam from the center of the pupil is less than 0.1% of the diameter of the pupil (e.g., less than 0.01% or less than 0.001% of the pupil diameter), with the chief ray of a component beam also being able to directly intersect with the center of the pupil.

It should be mentioned that, for example by way of further Kepler systems, further (conjugate) pupils can be generated in the device 100, at which further pupils further optical components can be attached accordingly. However, to reduce the system complexity of the optical set-up, it may be helpful to minimize the number of (conjugate) pupils. Should the pupil of the objective O be accessible, it is possible for example for the splitter B and/or the wavefront manipulator W to be arranged in the pupil P1 (or in the surround of the pupil P1) of the objective O. By way of example, it is also conceivable for the arrangement of the splitter B and wavefront manipulator W to be implemented in relation to exactly one conjugate pupil of the pupil P1 of the objective O. In one case, it is possible for example that only the splitter B is arranged in a pupil of the device, with the wavefront manipulator W being arranged in the surround of this pupil. In another case, it is possible for example that only the wavefront manipulator W is arranged in a pupil of the device, with the splitter B being arranged in the surround of this pupil. By way of example, both the wavefront manipulator W and the splitter B can be arranged in the vicinity or surround of a pupil in order to fulfil the boundary condition, described herein, for the incidence of the component beam into the pupil of the objective O. In this case, another optical element, for example, may be arranged (directly) in the conjugate pupil. Further, it should be noted that, as a result of arranging the splitter B and the wavefront manipulator W in a pupil or in the surround of a pupil of the device (for the purpose of fulfilling the boundary conditions mentioned herein), the sequence of arrangement of the splitter B and the wavefront manipulator can be as desired. For example, in FIG. 1B, the wavefront manipulator W could also be arranged at (or in the vicinity of) the pupil P3 and the splitter B could be arranged at (or in the vicinity of) the pupil P2. Then, the device could make do without the lens elements 1' and 2', for example.

It is also possible for the splitter B to be movable at the same time, with the result that it additionally enables a scanning of the component rays within a plane at the respective focal depth.

As described herein, the arrangement of the splitter B and/or wavefront manipulator W in relation to a pupil can ensure the optical quality of the foci of the component beams in the material T. In particular, reliable input coupling into the objective O or the focusing unit 3 is enabled by way of the arrangement. In this case, the optical quality of the foci can be further ensured by way of the adaptation of the wavefronts of the component beams by way of the wavefront manipulator W on the basis of the focal depth. By adapting the wavefronts, it is possible in the process to take account (as described herein) of the influence of the refractive index difference of the material T with respect to the refractive index of the surround of the material (e.g., the refractive index of a medium, such as air, a gas, or a liquid, that surrounds or adjoins the material) when focusing the component beams. In the process, the refractive index difference may for example cause a focal depth-dependent spherical aberration, which could not be compensated by way of a pure displacement of the objective O or focusing unit 3. However, according to the invention, a focal depth-dependent aberration can be substantially compensated for (or reduced), with the result that a functional 3-D focus generator is enabled since it is possible to ensure a reliable optical quality not only along a focal depth plane (i.e., in two dimensions) but over the entire depth of the material T. As described herein, the wavefronts of the component beams may be curved in the process, depending on the focal depth, by way of the wavefront manipulator W. The curvature or the curved profile of the wavefronts may depend on the refractive index of the material T and/or on the refractive index of the medium surrounding the material.

To explain the invention, reference is additionally also made to the relationships set forth below. In an example, the photon beam L may initially be exposed to the wavefront manipulator W and then to the splitter B, which is able to split the adapted photon beam L into m component beams (e.g., with m≥2). In this case, the wavefront of the photon beam L can be typically curved downstream of the wavefront manipulator W (e.g., on account of the focal depth-dependent wavefront adaptation, as described herein). If the splitter B is not arranged in the vicinity of a (conjugate) pupil, it is also possible that the m curved wavefronts of the component beams are displaced in relation to the pupil of the lens (or focusing unit), with the result that the foci of the component beams would have different focus qualities. Therefore, the splitter B can be arranged in the vicinity of a (conjugate) pupil, as described herein. In this example, it is possible to assume, on the one hand, that the wavefront manipulator W is arranged in the (conjugate) pupil. However, in the case of a positioning between the beam source of the device and the splitter B, the wavefront manipulator W need not necessarily be arranged in a (conjugate) pupil. By way of example, the wavefront manipulator W can also be displaced relative to the (conjugate) pupil and, for example, be arranged in a plane of a parallel beam path, with the parallel beam path being incident on the plane of the (conjugate) pupil (which is identifiable in FIG. 2, for example).

In another example, the photon beam L may initially be exposed to the splitter B which generates m component beams, with the m component beams subsequently being exposed to the wavefront manipulator W If the splitter B is not arranged in the surround of a conjugate pupil of the objective O or focusing unit 3 in the process, then the m chief rays of the m component beams are offset in the pupil and the component beams are partially cut-off as a result. As a result, the m foci of the component beams would vary in terms of quality. In this example, it is possible to assume, as a simplification, that the splitter B is arranged in the (conjugate) pupil.

The arrangement of the splitter B and wavefront manipulator W in the surround of a (conjugate) pupil or directly in a (conjugate) pupil can accordingly reliably ensure both the reliable adaptation of the wavefront of the component beams and the directional incidence of the component beams into the objective or focusing unit. The adaptation of the wavefront on the basis of the focal depth can be controlled by way of a computing unit, for example, as described (subsequently) herein.

Figure 2:
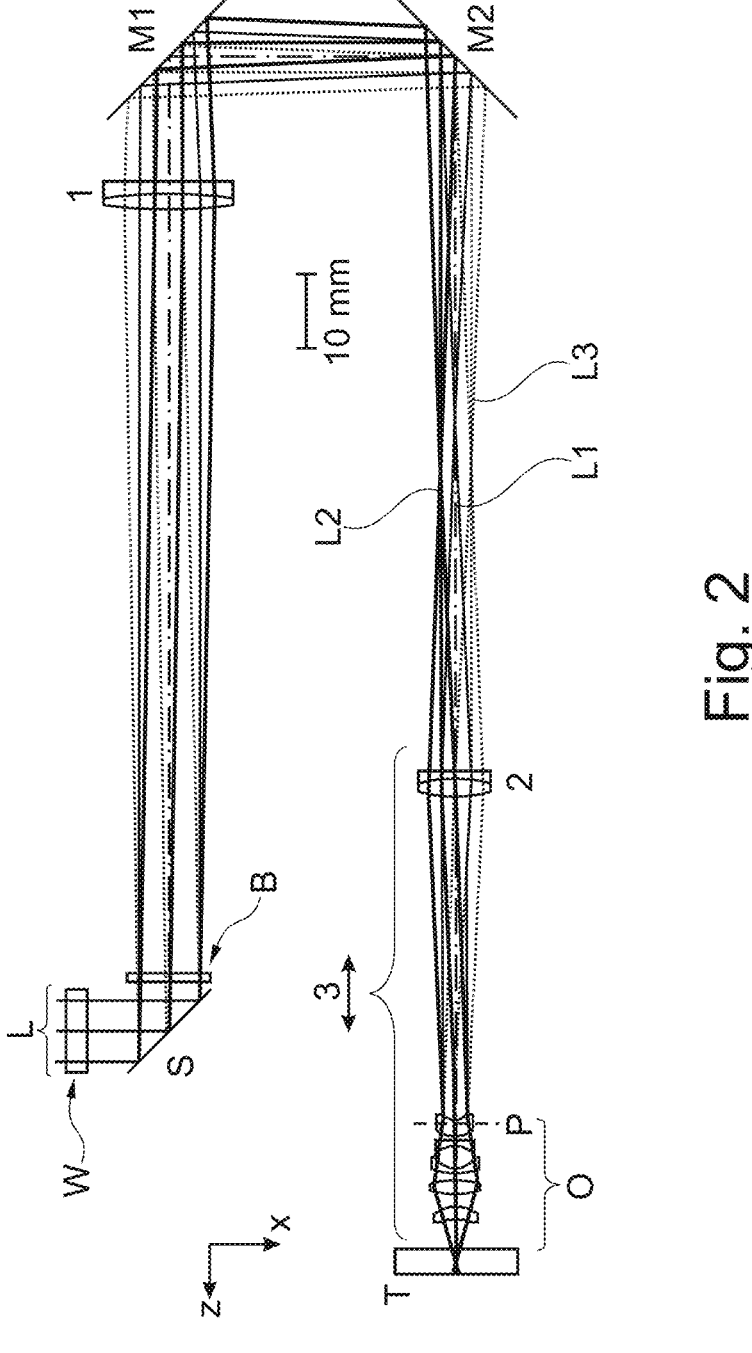
FIG. 2 schematically shows a second exemplary device in a side view.

FIG. 2 schematically shows a second exemplary device in a side view. What is possible to identify here is that the photon beam initially passes the wavefront manipulator W, which for example adapts the wavefront of the photon beam L on the basis of the focal depth. Subsequently, the photon beam is guided to a scanning mirror S. The scanning mirror S can deflect the photon beam as desired. By way of example, the scanning mirror S can be pivotable about one or more axes. By way of example, the scanning mirror S can also be displaceable along one or more axes. In this case, the scanning mirror S can be used as means for lateral deflecting (or scanning) the foci within the material, for example. In FIG. 2, the corresponding tilt of the scanning mirror S is not identifiable but three resultant beam paths of the photon beam IL, (tilted or deflected in relation to the optical axis) are depicted in exemplary fashion. In this case, the three deflections of the beam paths of the photon beam are marked by L1, L2, L3, with the chief ray and the marginal rays being depicted for each deflection of the scanning mirror S. The photon beam L (or a deflected photon beam L1, L2, L3) can be incident on the splitter B downstream of the scanning mirror S, the splitter splitting the photon beam L into a plurality of m component beams. The splitter B can split the photon beam into m≥2 component beams in this case. In this example, the splitter B can be designed to be transmissive with respect to the photon beam. In this case, the component beams generated by way of the splitter B are not identifiable in FIG. 2 as they cannot be depicted in resolved fashion at the present scale in the figure. It should be observed that it is therefore only the beam path of the deflected photon beams L1, L2, L3 which could be present without splitter B that is depicted. However, from the split at the splitter B described herein, it is evident that a deflected photon beam (e.g., L1, L2, L3) can correspond to a plurality of locally separable component beams as a result of the split. By way of example, the splitter B may comprise a diffraction grating, wherein the deflected photon beams L1, L2, L3 in FIG. 2 can correspond to the zeroth order of the diffraction grating and the other orders of diffraction cannot be specified on account of the resolution. Typically, the angle between the in component beams can be rather small, but large enough to cause m foci within the material T without their point spread functions overlapping. In this case, the angle between the m foci can be, for example, in the range from 0.02° to 0.2° or 0.05° to 0.1°, or, for example, of the order of 0.02°. In this case, the diameter of the photon radiation at the splitter B can be 0.5 mm to 50 mm or 2 mm to 25 mm, or approximately 15 mm, for example.

Following the split at the splitter B, the component beams are steered to a first lens element 1 and guided via two folding mirrors M1/M2 to a second lens element 2. In this case, the first lens element 1 and the second lens element 2 may form a Kepler system. In an example, the focus of the first lens element in this case is approximately in the region of the scanning mirror S. Further, the lens element 1 and the lens element 2 can be arranged in such a way that the focus of the first lens element 1 and the focus of the lens element 2 are arranged substantially at the same position (between the folding mirror M2 and lens element 2, as may be gathered from FIG. 2 for example; that is to say, a beam incident on the lens element 1 in parallel is rendered parallel again by the lens element 2). Further, a focus of the lens element 2 can be designed to be substantially in the pupil plane P of the lens.

By way of the device, the foci can be generated within the material T with a spherical or aspherical reference wave-front. In this case, the numerical aperture (NA) can be, for example, 0.3 to 0.5, 0.35 to 0.45 or approximately 0.37, wherein the wavelength of the photon beam can be 532 nm, for example. In this case, the material T may comprise quartz with a refractive index of n2=1.461. However, it is also conceivable that the material is a material with a refractive index of n2>1, at least n2>1.1, preferably at least n2>1.3, more preferably at least n2>1.4, wherein n2>1.5 may also hold true. The medium surrounding the material may comprise air in this case, with a refractive index n1=1. However, it is also conceivable that the medium is a medium with a refractive index n1>1, at least n1>1.1, preferably at least n1>1.3, more preferably at least n1>1.4, wherein n1>1.5 may also hold true. However, the refractive indices n2 and/or n1 may also comprise refractive indices which are at least greater than 1.7, at least greater than 2, at least greater than 3. In this case, the focal length of the first lens element 1 may comprise f1=200.4 mm. In this case, the focal length of the second lens element 2 may comprise f2=80.1 mm. The objective O may comprise a telecentric microscope objective lens with a focal length of f3=8.09 mm. However, depending on the optical design, other focal lengths of the optical components are also possible, which in terms of their dimensioning enable the corresponding functionality of the device. In this case, the microscope objective lens can be telecentric on the material side. This may comprise the pupil of the microscope objective lens being identical with the back focal plane of the microscope objective lens. In this case, the pupil plane of the microscope objective lens may be located in the microscope objective lens and not be accessible.

In this example, the pupil diameter DP of the microscope objective lens can be DP=6 mm. In the example of FIG. 2, the scanning mirror S can be embodied as a 2-D or 3-D scanning mirror. In this case, the neutral position of the scanning mirror S can be defined as a 90° deflection of the incident photon beam L. In this case, the fulcrum of the scanning mirror S can be assumed on the surface of the scanning mirror S, wherein the latter can be positioned in a focus of the first lens element 1. In this case, the maximum scanning angle can be defined as a maximum angle between a component ray reflected by the scanning mirror S in the neutral position thereof and a component ray reflected by the scanning mirror S in a tilted position. In an example, the tilt of the scanning mirror S is chosen so that the maximum scanning angle is for example 0.5 to 4 degrees, for example approximately one degree.

As mentioned, the pupil P of the microscope objective O can coincide with a focus of the second lens element 2. In this case, the microscope objective O and the second lens element 2 can be arranged on a common stage (e.g., a jointly movable mechanical unit). By way of example, the second lens element 2 and the microscope objective O can have a fixed distance from one another during operation. In this case, the lens element 2 and the microscope objective O can be displaced relative to the device, for example, by way of the displacement of the common stage, with however there being no relative displacement between lens element 2 and microscope objective lens. In this sense, the lens element 2 and the microscope objective O may form a focusing unit 3, which can be controlled by way of the movable common stage. By way of example, the focusing unit 3 can be moved along the optical axis of the device (e.g. by way of an appropriate control of the computer unit; the same may also apply to the focusing unit 3 in FIG. 1). Since the fulcrum of the scanning mirror S may be arranged in a focus of the first lens element 1, the component rays that emanate from the center of the scanning mirror S are parallel to an optical axis of the device between the first lens element 1 and the second lens element 2. By way of example, this can be gathered by way of the chief rays of the photon beams L1, L2, L3 of FIG. 2, since the chief ray of the photon beam L is incident on the center of the scanning mirror S. These component rays are refracted by way of the second lens element 2 and are focused on the pupil of the microscope lens (or the pupil of the objective O). Accordingly, the fulcrum of the 2-D scanning mirror S is imaged into the pupil of the microscope objective lens. In this case, this property (or this imaging) can be fulfilled independently of the position or the movement of the focusing unit 3.

In FIG. 2, the scanning mirror S can be arranged in a (conjugate) pupil of the device, for example. By way of example, the fulcrum of the scanning mirror S may in this case be arranged in the (conjugate) pupil. In FIG. 2, the wavefront manipulator W and the splitter 1 can be arranged accordingly close to the scanning mirror S, with the result that these are situated in the surround of this (conjugate) pupil in order to fulfil the boundary conditions described herein. However, the wavefront manipulator W may also be displaced along the beam path which is incident on the plane of the (conjugate) pupil. In other examples, the scanning mirror may for example also be designed as a wavefront manipulator W (e.g., adaptive mirror) and/or splitter B (e.g., diffraction grating) at the same time.

By way of example, the distance between objective O and material T can be chosen so that a beam which has an (approximately) flat wavefront in the pupil (of the objective O) has a given spherical wavefront or given astigmatic wavefront at a predetermined compensated focal depth (as described herein). Hence, a defined focus quality of the foci of the component beams can be ensured within the material T for a predetermined compensated focal depth, without requiring a wavefront adaptation, for example. The predetermined compensated focal depth can be at a depth corresponding to half the thickness of the material T (e.g., half the thickness of a substrate of a lithography mask); by way of example, a compensated focal depth can be 1 mm to 5 mm for example 3 mm to 3.5 mm. FIG. 2 depicts, in exemplary fashion, the focus for a predetermined compensated focal depth of d=3.175 mm. Therefore, the wavefront manipulator W can be in a neutral state in FIG. 2 since, for example, it requires no change in the optical quality of the foci. In the neutral state, the wavefront manipulator W does not substantially change the shape of the wavefronts. By way of example, the wavefront manipulator W may comprise a transmissive spatial light modulator (SLM), which is based on a liquid crystal for example.

In general, a spatial light modulator, SLIM, (as described herein) may, for example, be configured to modulate amplitude, phase, and/or polarization of a photon beam. The SLM may for example, be transmissive or reflective wherein the modulated photon beam is either transmitted through the SLM or reflected by the SLM. For example, a SLM may comprise a liquid crystal SLM (also termed LC-SLM). In such a case various (e.g., elongated) liquid crystals may be positioned within the SLM which may be adapted via an electrical field that may be applied via one or more electrodes within the SLM. The photon beam to be modulated may be transmitted through the liquid crystals. Each electrode may be addressed with a particular voltage to generate a desired electrical field within the SLM. When the electrical field is applied within the SLM, the liquid crystals may locally arrange in a specific way depending on the electrode voltages (e.g., such that the elongated shape of the liquid crystals is tilted in a specific way in an local area of the SLM). This may result in a local change of the refractive index within the SLM which may be used to modulate the wavefront of the photon beam that is exposed to the optical effect of the liquid crystals. For example, by tilting the liquid crystals a desired (local) phase change of the wavefront of the photon beam may be generated. For example, a (local) path difference may be generated by the SLM that may affect the electrical field of the photon beam and thus its wavefront. Hence, by modulating the electrical field within the SLM various wavefront types of the photon beam may be generated as is known in the optical technology sector.

Figure 3:
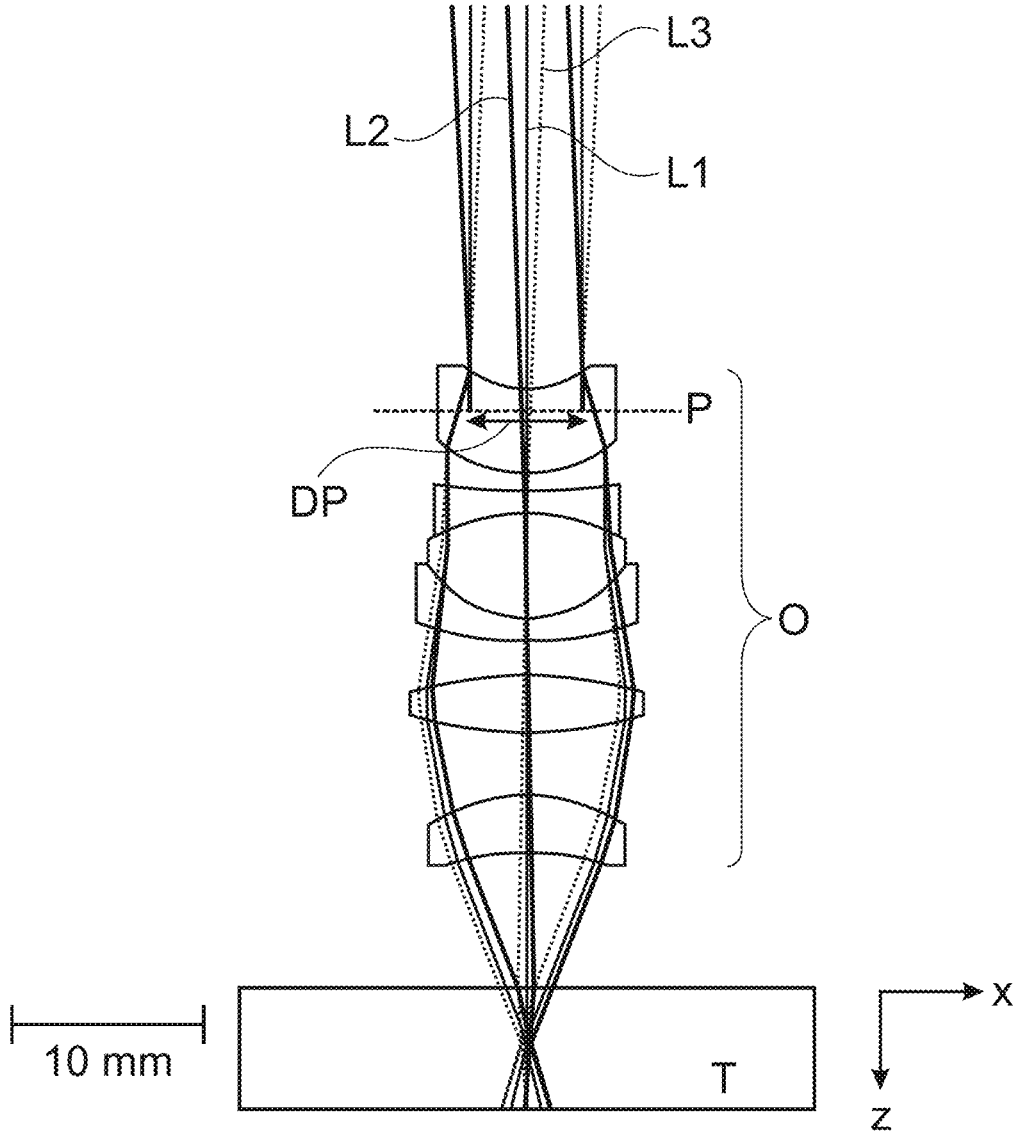
FIG. 3 schematically elucidates an objective O of an exemplary device in a side view.

FIG. 3 schematically elucidates the objective O of the exemplary device of FIG. 2 in a side view. As can be seen in FIG. 3 the objective O may comprise various lenses. The lenses may be arranged such that an incoming substantially parallel photon beam (e.g., the photon radiation L1, L2, L3) is focused onto a particular focus which may rised within material T. However, also other objectives are possible, such that the invention is not limited to the objective O of FIG. 3.

In FIG. 3, the chief rays of the photon radiation L1, L2, L3 (from FIG. 2) are highlighted in particular. It is apparent here that the foci of the photon radiation L1, L2, L3 are at a focal depth. Thus, the scanning mirror S can deflect the foci of the photon radiation or component beams laterally, over various angles, in a plane with a constant focal depth. It is also apparent from FIG. 3 that, in the plane in which the chief rays are closest together, the pupil is arranged in such a way that it is located in the back focal plane of the microscope objective lens. The chief rays between objective O and the material T are thus parallel to an optical axis, with the result that a telecentric objective O is present. In FIG. 3, it is not possible to resolve the component rays of the m>2 different component beams either on account of the small angle therebetween (as described herein).

In this case, the depth d of the foci within the material can be chosen by virtue of the focusing unit 3 being displaced along the optical axis and by virtue of a suitable optical path difference $\Delta W(d)$ being introduced for the wavefronts of the component beams by way of the wavefront manipulator W. In this case, the optical path difference $\Delta W(d)$ can be a function of the focal depth, which can be specified by d, for example. The optical path difference $\Delta W(d)$ may also be referred to herein as OPD, or as a change in the optical path length. In this case, the optical path difference can be introduced, for example, by way of a curvature of the wavefronts of the component beams, as described herein. To adjust the focal depth, it is also conceivable for the material T to be displaced along the optical axis and for the wavefronts to be adapted accordingly, in order to pre-compensate the wavefront deformation in the material T for different depths. Likewise, a focal depth can be adjusted by displacing the material T and the focusing unit 3. In this case, the lateral displacement of the foci along a focal depth requires, for example, no adaptation of the optical path length difference since the quality of the foci within the scope of a lateral displacement can be ensured (sufficiently) by way of the optical design of the device.

Further, the devices described herein may comprise a computing unit which can control the introduction of the optical path difference $\Delta W(d)$, for example. In this case, the computing unit can be related to the optical components via suitable interfaces, for example in order to control, adapt, and/or deflect, etc., the said components. In this case, the computing unit may comprise a corresponding computer program. Further, the device may also be controlled by way of an external interface, wherein the computing unit may be situated outside of the device, for example. Either way, the computing unit may for example be configured to receive signals and/or parameters from components of the device, to process the said signals and/or parameters and to return appropriate control signals.

Moreover, a device of the invention may comprise means for determining the focal depth. By way of example, a device may derive the focal depth from the position of the focusing unit 3 and/or this may be implemented by way of a detection of the photon radiation. By way of example, the focal depth can be transmitted to the computing unit of the device in the process, which computing unit can accordingly subject the means for adapting the wavefronts to closed-loop or open-loop control, with it also being conceivable that the adaptation means obtains the current focal depth from the determination means and adapts the wavefronts on the basis thereof.

The adaptation of the wavefronts to be implemented or the optical path difference $\Delta W(d)$ to be introduced can be described, for example, by way of a radial function in the case of spherical target wavefronts. Consequently, the wavefronts (of the component beams) are not incident in the form of approximately planar wavefronts on the pupil plane P, and so this results in different optical path differences in relation to the pupil plane P for different component rays (of the component beams), which in return may adapt the focus quality of the component beams in the material. By way of the optical path difference $\Delta W(d)$, it is therefore possible to control the curve profile of the wavefronts, with the result that the curved profile of the (curved) wavefronts may also be referred to herein as the profile of the optical path difference $\Delta W(d)$. In the case of a suitable choice of the function $\Delta W(d)$, it is possible to ensure that the RMS wavefront error between target state and actual state of the wavefronts of the component beam in the material is sufficiently small, and the focus quality is accordingly sufficiently large (as described herein). The curve profile to which the wavefronts should be adapted may for example be described by way of a function which depends on the focal depth d of the component beams present in the material T. The function may further depend on the refractive index $n_2$, which may correspond to the refractive index of the material T. Further, the function may be based on the refractive index $n_1$, which may correspond to the refractive index of the medium (e.g., air, an immersion medium, etc.) that surrounds the material T. In the case of spherical target wavefronts, the function may be described as depending on a radius r, with the radial coordinate r denoting the distance of a point from the chief ray. In this case, the radius r can for example be normalized to the radius $r_0$, which may correspond to the (delimiting) radius of the beam diameter in a plane (e.g., in a (conjugate) pupil plane). Thus, the radius r may correspond to a component ray of a beam, wherein a curvature is implemented by way of the function on the basis of r and consequently it is possible to generate a path difference in the pupil plane, for example of the objective O, for a corresponding component ray of radius r. For non-spherical target wavefronts in the material, $\Delta W(d)$ also depends on an azimuth angle $\alpha$ in addition to the radial coordinate r.

Thus, in summary, for spherical target wavefronts, the curve profile of the wavefront can be described in the radial direction r depending on the focal depth d present, on the predetermined compensated focal depth $d_0$, on the refractive index $n_2$ of the material and on the refractive index $n_1$ of the surrounding medium, and can also be described depending on the numerical aperture NA of a device (or its lens) according to the invention. For the focal depth-dependent reduction of an aberration of the foci of the component beams, it is possible to cause an optical path difference by way of the adaptation of the wavefronts, for example as discussed in section 3 of "Optical design of Zeiss ForTune photo mask tuning system: how generate diffraction-limited laser foci in thick specimens" (Proceedings Volume 10690, Optical Design and Engineering VII; 106900Y (2018), SPIE Optical Systems Design).

Thus, during operation and on the basis of focal depth d and the other given parameters, there can be an adaptation of the wavefronts in accordance with the function $\Delta W(r, d)$ in order to adapt the focus quality of the foci. In vivid terms, the specified function of the optical path difference $\Delta W(r, d)$ may (substantially) correspond to the desired curve profile of the wavefronts of the component beams in the pupil plane which may optimize the focus quality of the foci. With the arrangement of the adaptation means in the surround/vicinity of a (conjugate) pupil, it is possible for the curve profile to correspond, in particular, to the curve profile of the wavefronts induced by the wavefront manipulator W. Thus, the curve profile of the function described herein may be present in the wavefronts of the component beams directly downstream of the wavefront manipulator W. The radial curve of the optical path difference $\Delta W(r, d)$ may in this case also be specified directly as a function of the radius r or as a function of the normalization $r/r_0$. For the wavefront manipulator W, the chief ray of a component beam may (substantially) coincide with the center of the wavefront manipulator, with the result that it is correspondingly advantageously possible to design the radial profile of the curvature. Arising from the function, it is possible for the curvature of the wavefronts to have a symmetry along the axis of the chief ray. It should be mentioned that $\Delta W(d)$ is also frequently used herein as shorthand for the described function.

To implement the relationships in the function, the computing unit described herein may for example have stored and/or received the parameters $d_0$, $n_2$ and $n_1$. During operation, the focal depth d present can be received and/or determined by the computing unit in the present case. On the basis thereof, it is possible to determine the target state of the curve profile of the wavefronts by way of the function which causes an improvement in the focus quality. By way of example, the target state of the curve profile can be converted into a control signal used to control the adaptation means such that the latter carries out a corresponding adaptation of the wavefronts so that the target state can be achieved. Thus, this can ensure the optical quality of the foci independently of the focal depth d during operation.

Further, the device may comprise a beam source for generating the photon beam. By way of example, the beam source in this case may comprise a laser or short pulse laser, with the laser light being able to be used as photon radiation. Further, the beam source may also comprise further beam-shaping components, for example also for generating a pulsed laser light. In this case, the photon beam may comprise any desired wavelength. Thus, the photon beam may correspond to an electromagnetic wave having any desired wavelength. By way of example, a wavelength in the UV range, in the visible range, in the infrared range may be conceivable.

Figure 4:
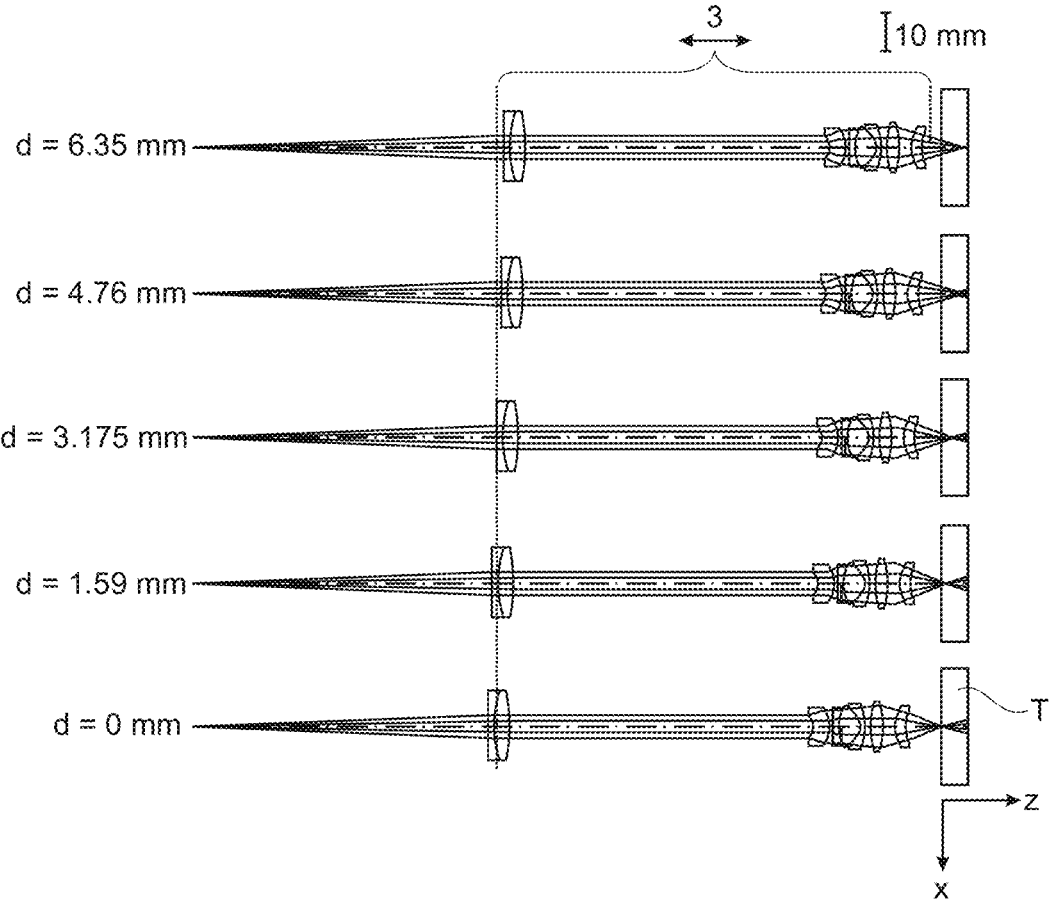
FIG. 4 shows different positions of an exemplary focusing unit for five focal depths within a material in a schematic view.

FIG. 4 shows different positions of the focusing unit 3 of the exemplary device of FIG. 2 for five focal depths within a material in a schematic view. By way of example, it is possible to identify how foci are generated on the surface of the material by virtue of the focusing unit 3 being displaced accordingly and there being a corresponding adaptation of the optical path difference $\Delta W(d)$. Thus, the focal depth in this case may correspond to d=0 mm; consequently, it is also possible to generate foci on the material by way of the device according to the invention. Additionally, further positions of the focusing unit 3 are specified in FIG. 4, together with the corresponding focal depths d. The offset of the focusing unit 3 along the optical axis (marked as z-direction) can be understood for various focal depths on the basis of the reference line. In this case, the set focal depths comprise d=1.59 mm, d=3.175 mm, d=4.76 mm and d=6.35 mm. As described herein, d=3.175 mm may correspond to the predetermined compensated focal depth. In this case, the focal depth d=6.35 mm may correspond to the lowermost plane of the material T and consequently correspond to the thickness of the material in this example. Proceeding from the predetermined focal depth d=3.175 mm of FIG. 3, the focusing unit here is displaced by ±2.17 mm along the optical axis for the purpose of implementing these two maximal positions.

Figure 5:
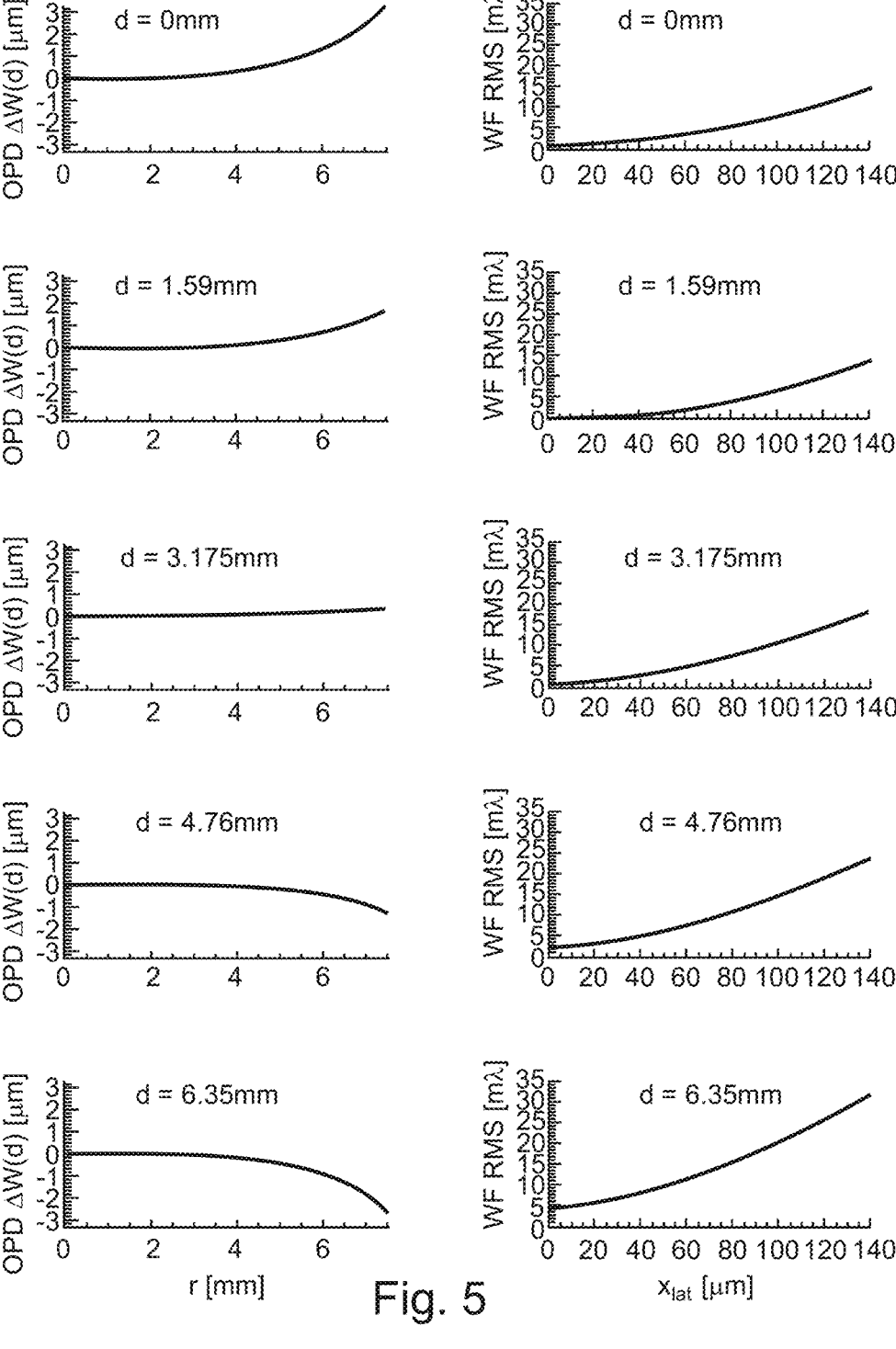
FIG. 5 shows the change in the optical path length of a component beam for five focal depths along a radial component in the left column while the right column in each case depicts the associated RMS wavefront error as a function of a lateral position.

For the case of a spherical target wavefront, FIG. 5 shows, in the left-hand column, the change in the optical path length of a component beam introduced by the wavefront manipulator W for compensation purposes, for five focal depths along the radial coordinate r. In this case, the radial coordinate r may proceed from a center of the wavefront manipulator W, wherein the chief ray of the photon beam can be substantially guided onto this center. Thus, the function of the curve profile of the wavefronts described herein can be introduced via the radial coordinate r of the wavefront manipulator, for the purpose of ensuring the optical quality of the foci. The right-hand column depicts in each case the associated remaining RMS wavefront error as a function of a lateral position $x_{lat}$. In this case, the lateral position can be implemented by way of the lateral deflection of the photon beam or component beam. At x=0, the scanning mirror S can be in its neutral position, for example, with values at x>0 corresponding to a lateral deflection of a focus of the component beam. In this case, the RMS wavefront error is constant for different foci of the relevant orders of diffraction of the splitter B, as shown in FIG. 5. In this case, the RMS wavefront error can be considered to be a parameter which specifies the optical quality of the foci. In particular, FIG. 5 represents the optical path difference OPD $\Delta W(d)$ and the RMS wavefront error for the focal depths d in FIG. 4. For d=3.175 mm, it can be gathered that the wavefront manipulator is in a (substantially) neutral state. In this case, the highest focus quality can be described by way of an RMS wavefront error that is less than 20 m. For example, this highest focus quality can be ensured for a lateral field radius of 100 µm for focal depths between d=0 mm and d=6.35 mm. This lateral deflection may in this case correspond to a scanning angle of the scanning mirror S of 0.40°. Should a relatively large RMS wavefront error be sufficient for an application, the field radius may be more than 140 µm, for example, and this may correspond to a scanning angle of greater than 0.40°. Alternatively, it may also be a property of the devices described herein that an RMS wavefront error in the neutral position of the scanning mirror S (or in the case of the absence of such a mirror) is less than 20 mλ, 10 mλ or even 5 mλ over a depth range of at least 2 µm, at least 4 µm or at least 635 µm.

Figure 6:
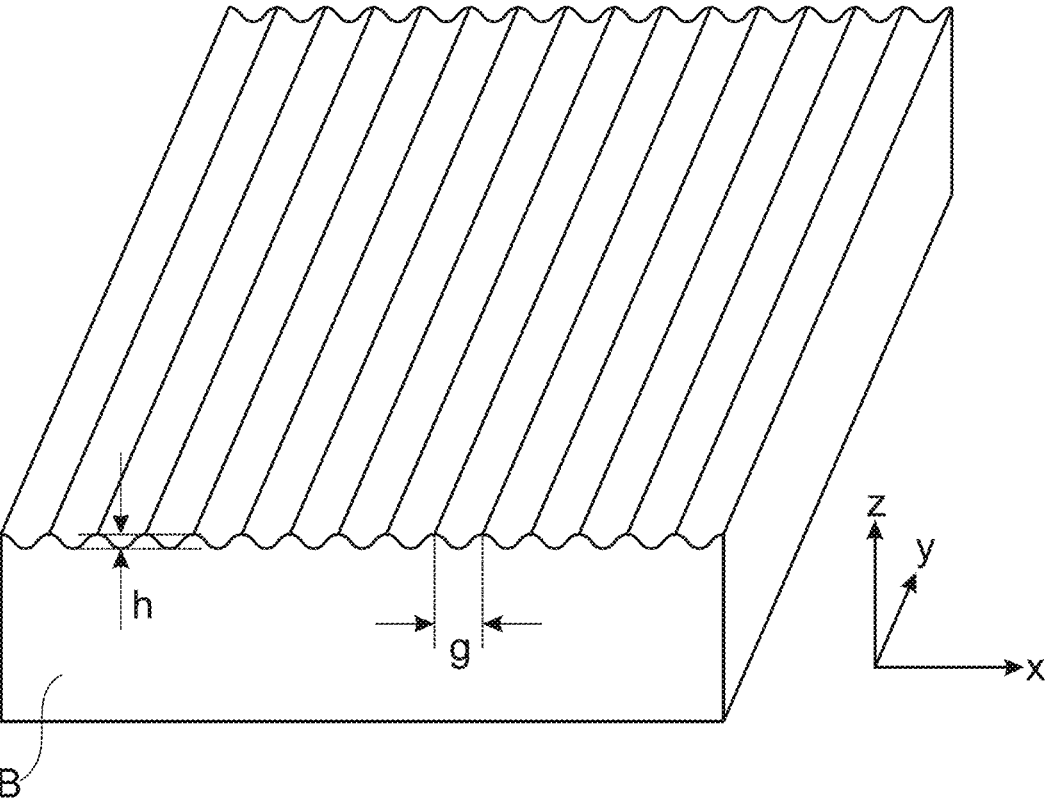
FIG. 6 shows an example of a diffraction grating, which can be used as splitting means in an exemplary device.

FIG. 6 shows a first diffraction grating, which can be used as splitting means in an exemplary device. Thus, the first diffraction grating from FIG. 6 can be used as splitter B, for example. By way of example, it is possible to generate m=3 component beams by way of such a diffraction grating, and consequently it is possible to simultaneously generate 3 foci in the material. This can be ensured by using a line grating as a diffraction grating, which diffracts an incident beam (e.g., the photon beam) into a plurality of beams (e.g., the component beams). The component beams generated thus may differ only in terms of their angle with respect to the optical axis (or their tilt in this respect), for example. The diffraction grating may comprise a slab made of an optical glass. In this case, the diffraction grating may comprise a refractive index $n_b$ at a wavelength $\lambda$=532 nm, wherein one side of the diffraction grating may comprise a sinusoidal phase grating. By way of example, the groove width or half period of the sinusoidal form can be specified as g and the groove depth from peak to trough (or the peak-trough value of the sinusoidal form) may be specified as h. By way of diffraction, the phase grating is able to split the incident photon beam into a plurality of component beams in the direction of the first lens element 1 (as may be gathered from FIG. 2, for example). As known from the field of optics, the intensity $I_q$ of a diffracted beam of order of diffraction q, which was diffracted from a sinusoidal phase grating, can be sufficiently described.

Thus, the following may apply:

$$I_q = I_i \eta_q \text{ with } \eta_q = J_q^2\left(\pi \cdot \frac{h}{\lambda} \cdot (n_{bs} - 1)\right)$$

where $I_i$ comprises the intensity of the incident beam, $\eta_q$ comprises the diffraction efficiency of order q and $J_q$ comprises a Bessel function of the first type, of order q. As a result of the symmetry of the sinusoidal phase grating, the following may apply: $I_q = I_{-q}$. A beam diffracted into the order of diffraction q can generate a focus with number q, which may comprise an energy dose that is proportional to the intensity $I_q$. The energy dose of the foci can be adjusted by adapting (or choosing) the groove depth b of the sinusoidal phase grating. It should be mentioned that the intensity $I_q$ and hence the energy doses of the foci may be independent of the groove width g of the sinusoidal phase grating.

It may be advantageous within the scope of generating m different foci for the m different component beams to comprise the same intensity $I_q$. $J_0$ (1.4347)=$J_1$ (1.4347)=$J_{-1}$ (1.4347) applies to the Bessel functions of the first type. By choosing the groove depth h according to $$h = \frac{1.4347}{\pi} \cdot \frac{\lambda}{n_{bs} - 1},$$

it is possible to obtain the following intensities for the orders of diffraction q=0, +1, −1:

$$I_0 = I_i \cdot J_0^2(1.4347) = I_i \cdot 0.548^2 = I_i \cdot 30\%$$
$$I_{\pm 1} = I_{-1} = I_i \cdot J_1^2(1.4347) = I_i \cdot 0.548^2 = I_i \cdot 30\%$$

Accordingly, m=3 beams of orders of diffraction q=0, +1, −1 are obtained with this groove depth h, with each of these (diffracted) beams having 30% of the intensity L of the beam incident on the diffraction grating. The remaining diffracted beams of other orders of diffraction accordingly together comprise 10% of the intensity Il of the beam incident on the diffraction grating and consequently can be neglected (each further order of diffraction consequently has a significantly lower intensity, specifically at least 6-times lower than that of each of the three beams of equal strength). If the splitter B (formed as a diffraction grating described herein) is constructed from a slab with a thickness of 2 mm (e.g., made of Schott glass N-BK7) and a refractive index of nbs=1.51947 at a wavelength of 532 nm, then the corresponding groove depth h can be as follows:

$$h = \frac{1.4347}{\pi} \cdot \frac{0.532 \text{ µm}}{1.51947 - 1} = 0.468 \text{ µm}.$$

Naturally, other parameters are also possible in other examples.

In an example, the groove width g of the sinusoidal phase grating can be chosen so that adjacent foci within the material T comprise a distance of i=x*$r_{Airy}$, where $r_{Airy}$ corresponds to an Airy radius, where x may be chosen from the range of 1 to 20, 3 to 15, 6 to 10 or, for example, equal to 8. One Airy radius can be described as $r_{Airy}$=0.61·

$$\frac{\lambda}{NA} = 0.61 \cdot \frac{0.532 \text{ µm}}{0.37} = 0.877 \text{ µm. } i = 8 * r_{Airy}$$

can for example be achieved with a choice of a groove width g according to $$g = \frac{D_{bs}}{1.22 \cdot i},$$

where $D_{bs}$ denotes the beam diameter of the beam incident on the diffraction grating. The beam diameter can satisfy $D_{bs}$=15 mm in one example. Accordingly, the groove width g can be chosen as g=1.537 mm, for example. For a beam incident on the diffraction grating with the angle of incidence $\theta_i$ and the angle of emergence $\theta_q$ of a radiation beam of order of diffraction q diffracted from the diffraction grating, the following known diffraction grating equation applies:

$$\sin\theta_q = -q \cdot \frac{\lambda}{g} + \sin\theta_i.$$

Therefore, the angle between the beam of order diffraction q=0 and q=±1 can (approximately) be given by $$1 \cdot \frac{\lambda}{g} \text{rad} = \frac{180°}{\pi} \cdot \frac{\lambda}{g} = \frac{180°}{\pi} \cdot \frac{0.532 \ \mu m}{1537 \ \mu m} = 0.02°.$$

Thus, this angle can be substantially smaller than the scanning angle of the scanning mirror S (as described herein). In summary, the sinusoidal phase grating with parallel grooves in the y-direction on one side of the splitter B over a surface can be described as follows:

$$z(x, y) = \frac{h}{2} \cdot \cos\left(360° \cdot \frac{x}{g}\right),$$

where h=0.468 μm and g=1.537 mm.

It should be mentioned that the relationships and parameters described herein, for the phase grating of the first diffraction grating, may also be applied to more than three component beams and also to other spacings of the foci within the material.

Figure 7:
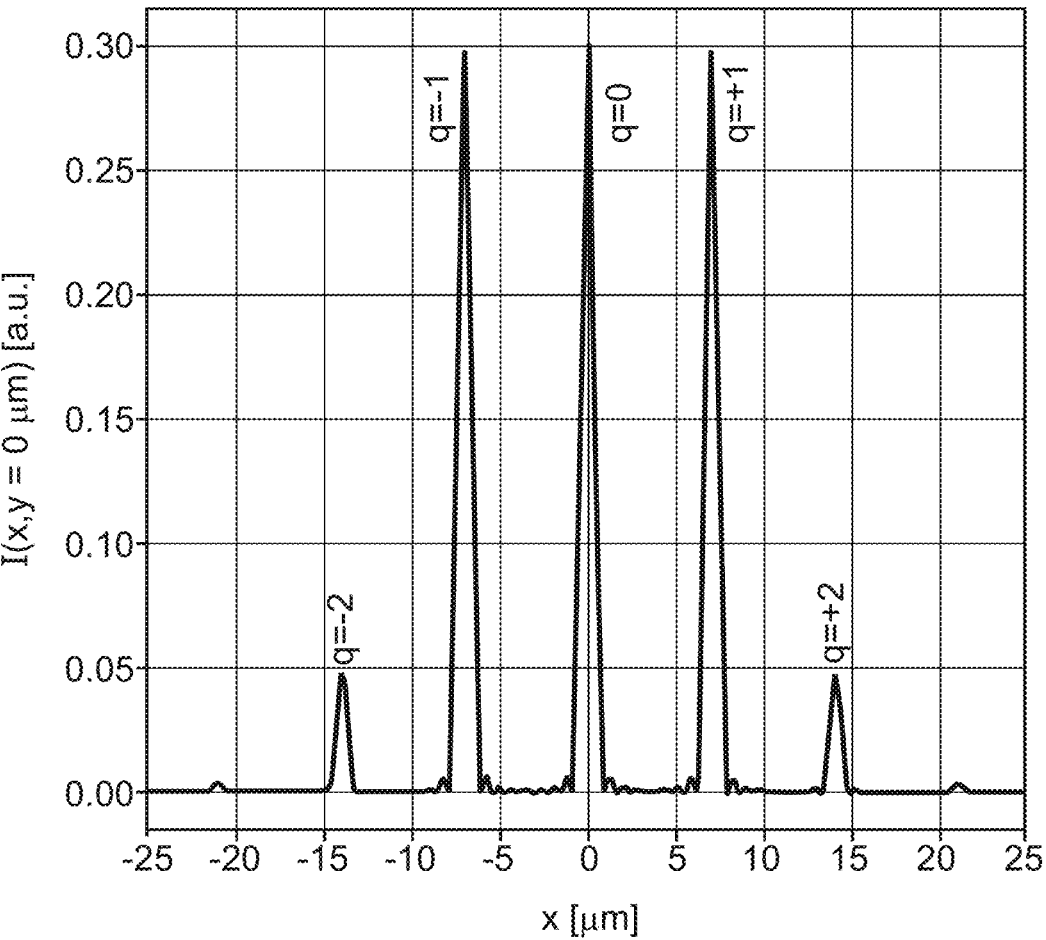
FIG. 7 shows an exemplary intensity distribution of the foci of the component beams within the material at a focal depth along a lateral direction.

FIG. 7 qualitatively shows the intensity distribution of the foci of the component beams within the material at a focal depth along a lateral direction. In this case, the intensity distribution may correspond to the intensity distribution which is caused by way of the sinusoidal phase grating from FIG. 6 with the parameters specified herein. In this case, the x-axis is chosen so that it is parallel to the foci of the component beams (or the x-axis may correspond to the lateral direction in relation to a focal depth). In this case, the position x=0 μm is chosen in such a way that the position coincides with the focus of the order of diffraction q=0. In this case, it is possible to read from FIG. 7 that m=3 foci with a (substantially) equal intensity arise, which correspond to the orders of diffraction q=0, q=+1 and q=−1. Further, it is possible to read that these foci (approximately) have a distance of Δx=7 μm from one another. Likewise, the foci of the component beams of the orders of diffraction q=+2 and q=−2 are recognizable, but these have a substantially lower intensity. By way of example, the foci with the lower intensities do not cause any local material modification as a result of this intensity difference. Thus, it is possible to provide a plurality of foci, with all foci that cause a material modification having a substantially equal intensity. In respect of the sinusoidal phase grating, it is thus possible to mention in summary that the latter splits the photon beam L incident from the scanning mirror S into in m=3 component beams, which have an angle of 0° and ±0.02° with respect to the incident photon beam. Consequently, by way of the device it is possible to simultaneously generate m=3 foci (of the component beams) within the material, which foci have the same energy dose and are spatially separated from one another, for example by 8·r_{Airy}=8·0.877 μm=7 μm. It should be mentioned that this pattern of the three foci can be displaced laterally within the material by way of the scanning mirror S.

As a result of the exemplary device from FIG. 2 and the first diffraction grating as a splitter B, it is possible to attach the diffraction grating in the vicinity of a conjugate pupil of the lens, with the result that the boundary condition (described herein) for the chief rays in the pupil of the lens is satisfied. By way of example, this can be understood by way of a component ray tracing (e.g., by way of ray tracing). By way of example, this can be implemented starting with a component ray (e.g., a chief ray) at the splitter B and the inclusion of an angle of 0.02° (i.e., the angle between the beam of the order of diffraction q=0 and q=±1 in the parameter example described herein) with the normal of the splitter B. The profile of this component ray can subsequently be traced through the device. In the process, the distance between the intersection of the component ray in the pupil plane P and the center of the pupil can be calculated for this component ray. A distance of I_d=2 μm arises for all (possible) positions of the focusing unit 3 with the parameters, specified herein, of the first diffraction grating. It should be mentioned that the pupil diameter DP in this example is DP=6 mm. Therefore, the condition that the distance I_d is at least less than 10% of the pupil diameter (and also less than at least 1%, less than at least 0.1% of the pupil diameter DP) is satisfied in this example. It is consequently possible to ensure the optical quality of the foci of the component beams.

Figure 8:
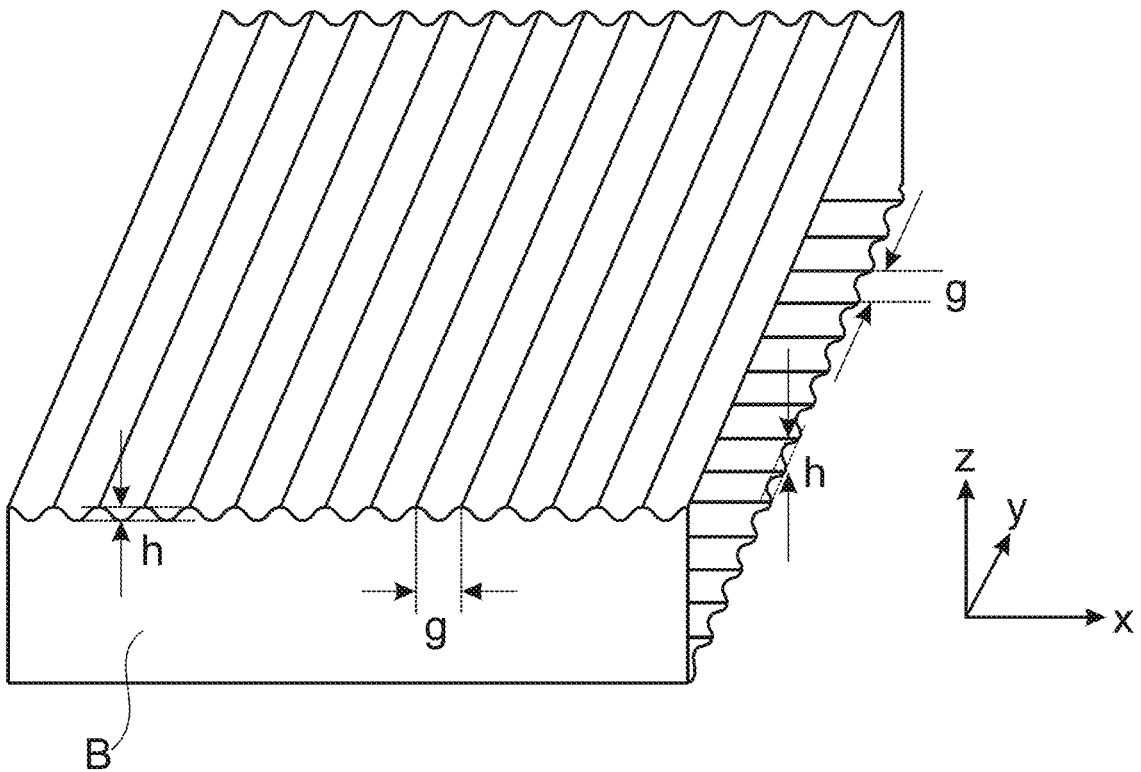
FIG. 8 shows a further diffraction grating, which can be used as splitting means in an exemplary device.

FIG. 8 shows a second diffraction grating, which can be used as splitting means in an exemplary device. Thus, the second diffraction grating can for example be used as splitter B in the exemplary device of FIG. 2. By way of example, it is possible to generate m=9 component beams by way of such a second diffraction grating, and consequently it is possible to simultaneously generate m=9 foci in the material T. In this case, the second diffraction grating may comprise a sinusoidal phase grating on two sides, as may be gathered from FIG. 8. The lateral extent of the totality of the foci within the material, which may be present simultaneously in the case of an exposure with the photon beam L, may comprise 200 μm×200 μm in this example. The lateral extent of the totality of the foci may also be referred to as focus volume. Consequently, a comparatively large region of influence in the material can be addressed during an exposure with the photon beam L. For example, the distance between the in =9 foci within the material can be approximately 50 μm to 80 μm, for example 66.66 μm. By way of example, by way of the focal length of the objective O and the lens elements 1, 2, it is possible to specify the angle θ between adjacent foci on the second diffraction grating as:

$$\theta = \arcsin\left(\frac{66.66 \ \mu m}{f_{lens}} \cdot \frac{f_2}{f_1}\right) = \arcsin\left(\frac{66.66 \ \mu m}{8.09 \ mm} \cdot \frac{80.1 \ mm}{200.4 \ mm}\right) = 0.189°.$$

By way of example, the second diffraction grating may be formed from a slab which comprises Schott N-BK7 glass with a thickness of 2 mm. In order to enable the pattern with m=9 foci in a 3×3 arrangement with a lateral focus spacing of 66.66 μm within the material, the sinusoidal phase gratings on the two sides of the second diffraction grating may be designed in defined fashion. In this example, the sinusoidal phase gratings may have a (substantially) identical profile. Speaking figuratively, each sinusoidal phase grating can generate m=3 beams from an incident beam. When the photon beam L is incident on a side of incidence of the second diffraction grating, it is thus possible to initially generate m=3 beams by way of the phase grating on the side of incidence. These m=3 beams can then be incident on the phase grating on the other side. Accordingly, this phase grating can generate three respective beams on the emergent side (by way of diffraction) from each beam, with the result that a total of m=9 beams and consequently m=9 foci can be generated by way of the second diffraction grating. In this case, the two phase gratings on the side of incidence and side of emergence of the second diffraction grating may have a groove depth of h:=0.468 μm and a groove width of g=λ/sin θ=0.532 μm/sin 0.1890=161.3 μm. In the process, the first and the second sinusoidal phase grating of the second diffraction grating may be described by way of the surfaces $z_1(x,y)$ and $z_2(x,y)$ according to:

$$z_1(x, y) = \frac{h}{2} \cdot \cos\left(360° \cdot \frac{x}{g}\right) \text{ and } z_2(x, y) = \frac{h}{2} \cdot \cos\left(360° \cdot \frac{y}{g}\right).$$

Figure 9:
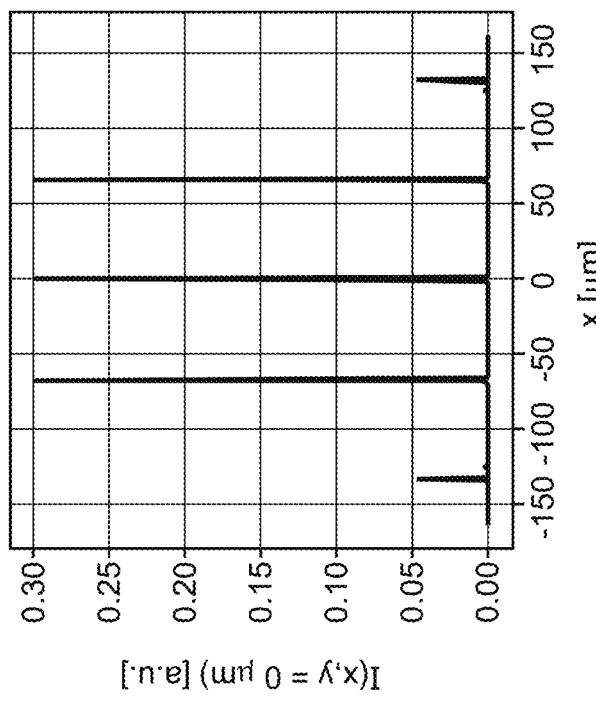
FIG. 9 shows an exemplary intensity distribution of the component beams within the material at a focal depth.
Figure 9:
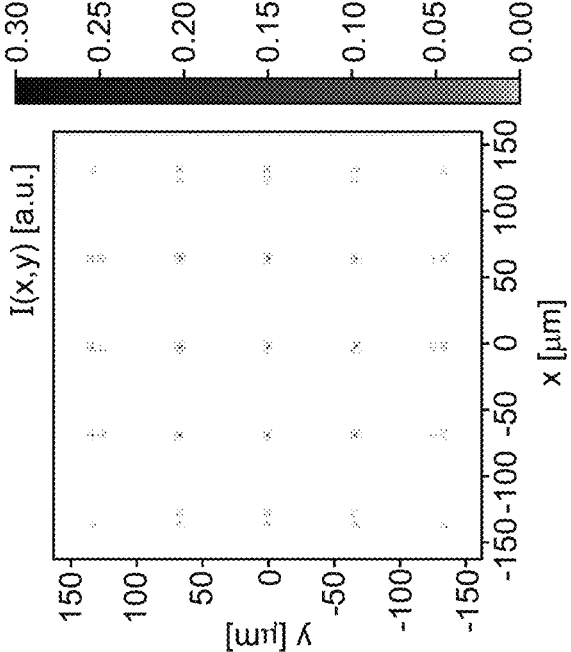

FIG. 9 shows qualitatively the intensity distribution of the component beams within the material at a focal depth, with the intensity distribution being caused by the diffraction at the exemplary second diffraction grating.

In this case, it is evident that the arrangement of the foci within the material can be implemented within a 3×3 matrix, the foci having a distance from one another of 66.66 μm. In this case, the parameters of the second diffraction grating are chosen so that all m=9 foci have (substantially) the same intensity.

A similar arrangement of the foci or a similar pattern of the foci as in FIG. 9 can also be obtained by way of a diffraction grating which has a diffractive optical element on only one side (e.g., only one phase grating). In this case, the surface $z(x,y)$ can for example be described as:

$$z(x, y) = \frac{h}{2} \cdot \cos\left(360° \cdot \frac{x}{g}\right) + \frac{h}{2} \cdot \cos\left(360° \cdot \frac{y}{g}\right).$$

In the case of the second diffraction grating as a splitter B, too, it is possible to attach the second diffraction grating in the vicinity of a conjugate pupil of the lens, with the result that the boundary condition (described herein) for the chief rays in the pupil of the lens is satisfied. By way of example, this can be understood by way of a component ray tracing (e.g., by way of ray tracing), By way of example, this can be implemented starting with a component ray (e.g., a chief ray) at the splitter B and the inclusion of an angle of $\sqrt{2} \cdot 0.139° = 0.27°$ with the normal of the splitter B. The profile of this component ray can subsequently be traced through the device. In the process, the distance between the intersection of the component ray in the pupil plane P and the center of the pupil can be calculated for this component ray. A distance of $I_d = 27$ μm arises for all (possible) positions of the focusing unit 3 with the parameters, specified herein, of the second diffraction grating. It should be mentioned that the pupil diameter DP in this example is DP=6 mm. Therefore, the condition that the distance $I_d$ is at least less than 10% of the pupil diameter (and also less than at least 1% of the pupil diameter DP) is satisfied in this example. It is consequently possible to ensure the optical quality of the foci of the component beams.

Figure 10:
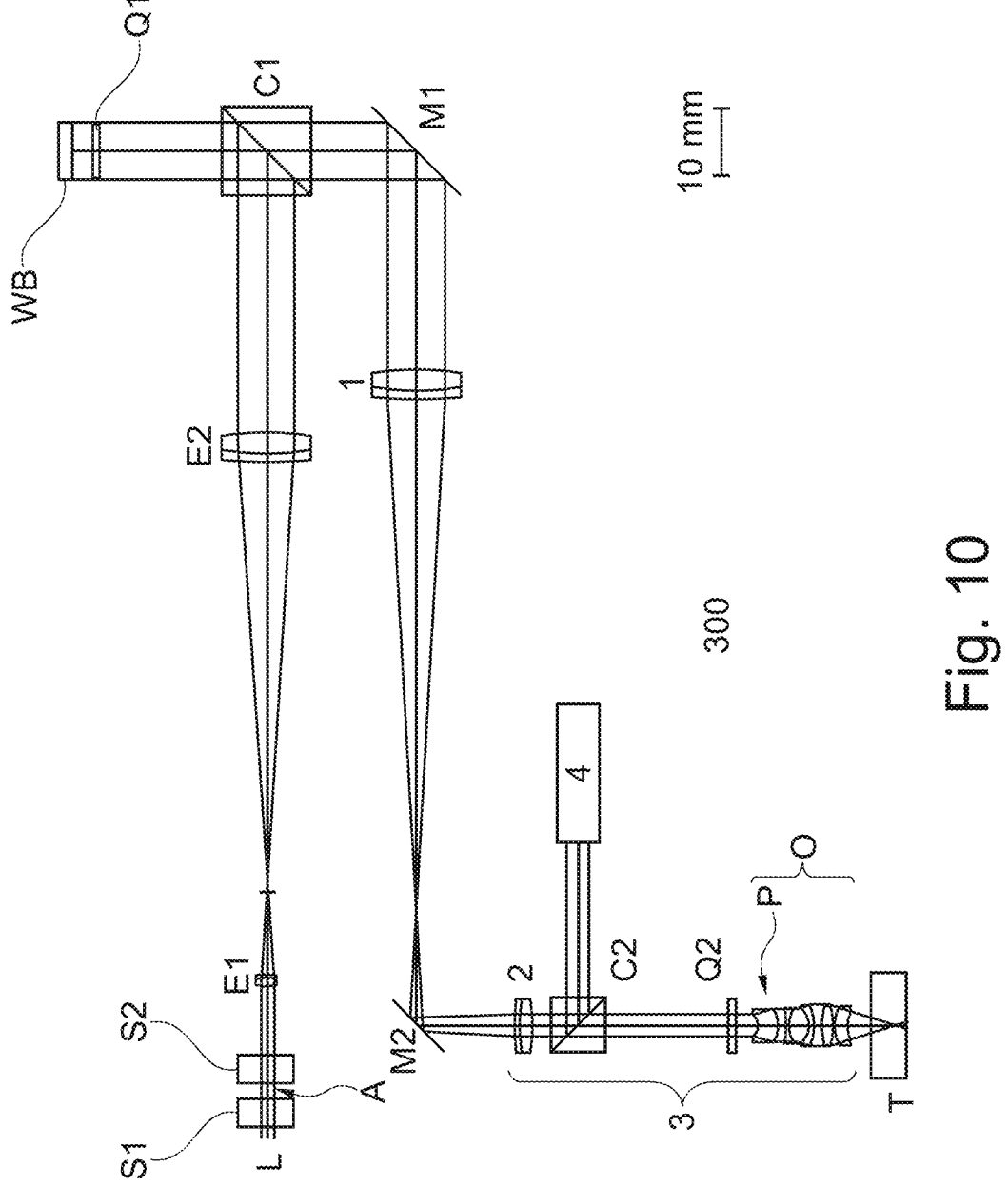
FIG. 10 schematically shows a third exemplary device, in which the splitting means comprises the adaptation means, in a side view.

FIG. 10 schematically shows a third exemplary device, in which the splitting means comprises the adaptation means, in a side view. In this case, splitting the photon beam L and adapting the wavefronts of the component beams can be implemented by way of the phase modulator WB. In this case, the phase modulator WB can comprise a spatial light modulator (SLM), with the phase modulator WB also being capable of modulating the intensity. For example, a liquid crystal, LC-SLM (e.g., a liquid crystal on silicon (LCoS) SLM) is conceivable as a phase modulator WB in this case. In this case, a photon beam L incident on the phase modulator WB can be converted by the said phase modulator WB into a plurality of component beams, with the wavefronts of the component beams likewise being able to be adapted by way of the phase modulator. Here, in the case of the exemplary third device 300 in FIG. 10, the objective O and the material T are substantially the same as the objective O and the material T of the first and the second exemplary device. In this case, the focal length of the first lens element 1 can be f1=150 mm. In this case, the focal length of the second lens system 2 can be f=60 mm. Further, the third exemplary device 300 may comprise two acousto-optic deflectors (AODs) S1, S2 for the lateral deflection of the foci. The third device 300 may further comprise a wavefront sensor 4. Here, the phase modulator WB of the third device 300 may be used in reflection. The diameter of the photon beam L is initially expanded in the device 300. For example, prior to incidence on the AODs S1, S2, the photon beam L has a diameter of 3 mm. After passing through the AODs S1, S2, the diameter can be expanded by way of a telescope which may comprise two focal lenses E1, E2. In this case, the magnification of the telescope can be m=5 with the result that the diameter can be increased to D=15 mm. Consequently, this exemplary diameter of D=15 mm can be adapted to the diameter of the phase modulator WB (e.g., the LCoS SLM). In the process, the phase modulator WB can receive the photon beam L via a corresponding guidance of the photon beam L in the device 300. For example, this guidance of the photon beam L onto the phase modulator can be implemented via a polarizing beam splitter C1 and a quarter-wave plate Q1 In the process, the phase modulator WB may be attached to a (conjugate) pupil of the device 300, with the result that the phase modulator can be imaged into the pupil of the telecentric lens. In this case, imaging can be implemented via the first lens element 1 and the second lens element 2. Further, the device 300 may comprise a beam splitter C2 downstream of the second lens element 2 in the beam direction. In this case, the beam path emerging from the beam splitter C2 can be guided to the wavefront sensor 4. The wavefront sensor 4 can enable a control of the adaptation of the wavefronts, for example in the form of a closed-loop control. In this case, the radiation of the component beam adapted by the phase modulator WB can be measured by the wavefront sensor 4 via the beam splitter C2. In particular, this allows the wavefronts of the component beams to be determined. By way of the actual determination of the wavefronts (e.g., the actually present curvature), it is possible to control and set the optical path difference OPD, which is introduced for the component beams by the phase modulator WB, in a targeted manner. In this example, the phase modulator WB is in a conjugate plane of the pupil for all positions of the inner focusing mechanism, for example for all positions of the focusing unit 3. Consequently, it is possible to ensure that all m component rays that pass through the center of the phase modulator WB intersect the pupil of the lens substantially at the center of the objective O or at a point according to one of the boundary conditions described herein. A further quarter-wave plate Q2 can be provided upstream of the objective O. In the case of a suitable rotation, this quarter-wave plate can ensure that the linearly polarized photon radiation is converted into circularly polarized photon radiation. This ensures that there is no polarization-related asymmetry in the foci, even in the case of large apertures.

In principle, any desired number m of foci or any desired number m of component beams can be generated by way of the phase modulator WB (e.g., a LCoS SLM), where m≥2. The phase modulator WB can likewise allow the foci of the component beams to be arranged in any desired pattern at the focal depth of the material T. In this case, the generation of a plurality of component beams from an incident beam by way of a phase modulator WB is known from the field of optics; in the process, it is possible to generate properties of the component beams defined with a high degree of freedom (e.g., a defined spatial separation, a defined number, a defined tilt of the component beams, etc.).

Figure 11:
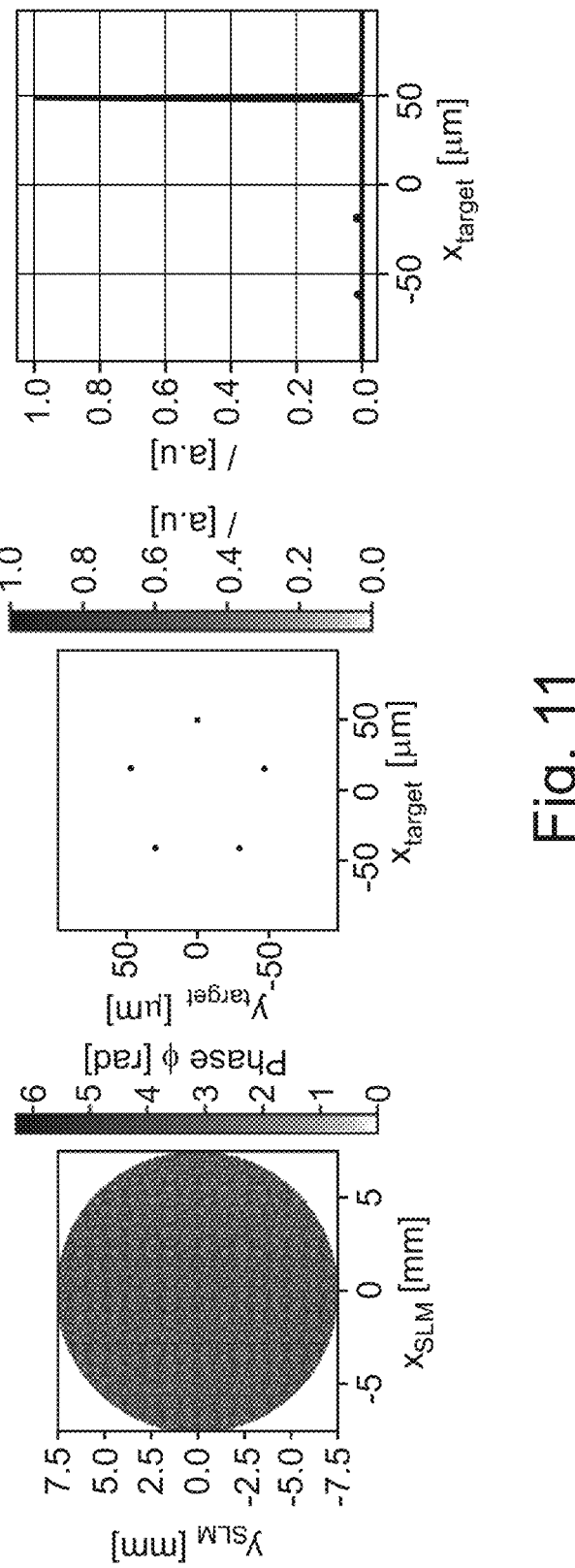
FIG. 11 qualitatively shows the phase distribution of the adaptation means of the third exemplary device, which causes a first arrangement of the foci, with the qualitative intensity distribution of the component beams within the material at the focal depth also being depicted.
Figure 14:
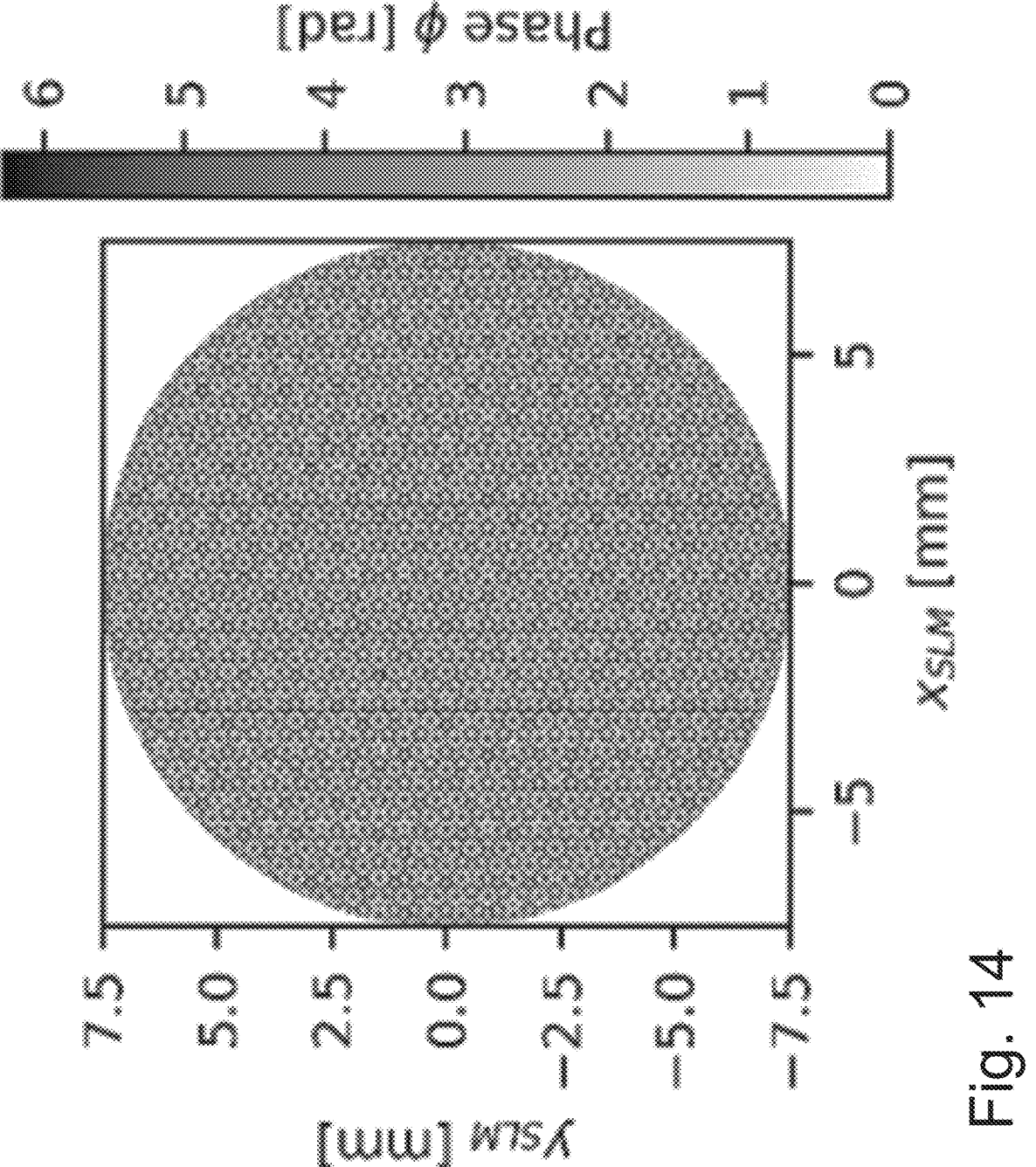
FIG. 14 shows an enlarged view of the phase distribution shown in FIG. 11.

In this context, FIG. 11 qualitatively shows the phase distribution of the adaptation means of the third exemplary device 300, so that m=5 foci are induced in a circular arrangement by way of the phase modulator WB. FIG. 14 shows an enlarged view of the phase distribution shown in FIG. 11. In this case, the qualitative intensity distribution of the component beams within the material at the focal depth is also illustrated. Here, the intensity distribution is illustrated in accordance with the known Fraunhofer diffraction.

Here, it is possible in the left-hand diagram to identify the local phase change induced by the phase modulator WB as a function of x- and y-direction. Also identifiable in this case is, for example, the diameter D=15 mm of the phase modulator WB, which may represent the active region thereof. The exemplary arrangement of the foci in the xy-plane at the focal depth (with $x_{target}$ as x-axis and $y_{target}$ as y-axis) is identifiable in the central diagram. It is evident here that the m=5 foci are arranged at a radius of r=50 µm, with the foci having the same distance from one another. Further, the intensity along the x-direction at the focal depth is also presented for one focus. It should be mentioned that, naturally, further arrangements or patterns of the foci, which can be implemented by way of the phase modulator WB, are conceivable in addition to this specific example.

Further, the implementation of the focus pattern in this example can be discussed in more detail. In order to obtain the lateral separation of the m foci at the same focal depth d within the material T, it is possible to adjust the electric field of the desired component beams in a targeted manner by way of the phase modulator WB. By way of example, it is possible to assume in the process that the electric field $E(x_{SLM}, y_{SLM})$ of the component beams may represent a linear composition of planar waves, which for example can be described according to the known Fourier optics:

$$E(x_{SLM}, y_{SLM}) = e^{-j2\pi\cdot\Delta W(d)}\sum_{i=0}^{m-1} e^{-j(k_{x,i}x_{SLM}+k_{y,i}y_{SLM})}.$$

In this case, $k_{x,i}$ and $k_{y,i}$ correspond to the corresponding components of the wave vector of the i-th focus, with $$|k_i| = k = \frac{2\pi}{\lambda}.$$

To a good approximation, the desired electric field of the component beams can be generated by way of a pure phase modulation of the uniform incident field (of the photon beam L).

To be able to implement m=foci within the material, which foci in the process are arranged regularly in a circular ring and at the radius r=50 µm, it is possible to adapt the components of the wave vectors, for example as follows:

$$k_{x,i} = r\cdot\sin\left(\frac{i\cdot2\pi}{m}\right)\cdot\frac{k}{f} \text{ and}$$

$$k_{y,i} = r\cdot\cos\left(\frac{i\cdot2\pi}{m}\right)\cdot\frac{k}{f}.$$

In this case, f=20.22 mm may hold true, and this may correspond to the effective focal length of the optical elements which follow the phase modulator WB in the beam path as far as the material.

If higher orders of diffraction are neglected, further desired patterns can be realized using the phase modulator WB by way of a suitable choice of $k_{x,i}$ and $k_{y,i}$. Notably, in the above example, by choosing m=5 foci the phase modulator WB may function as a means for splitting (as 5 spatially separated foci are generated) and as a means for adapting the wavefront of the component beams.

Figure 12:
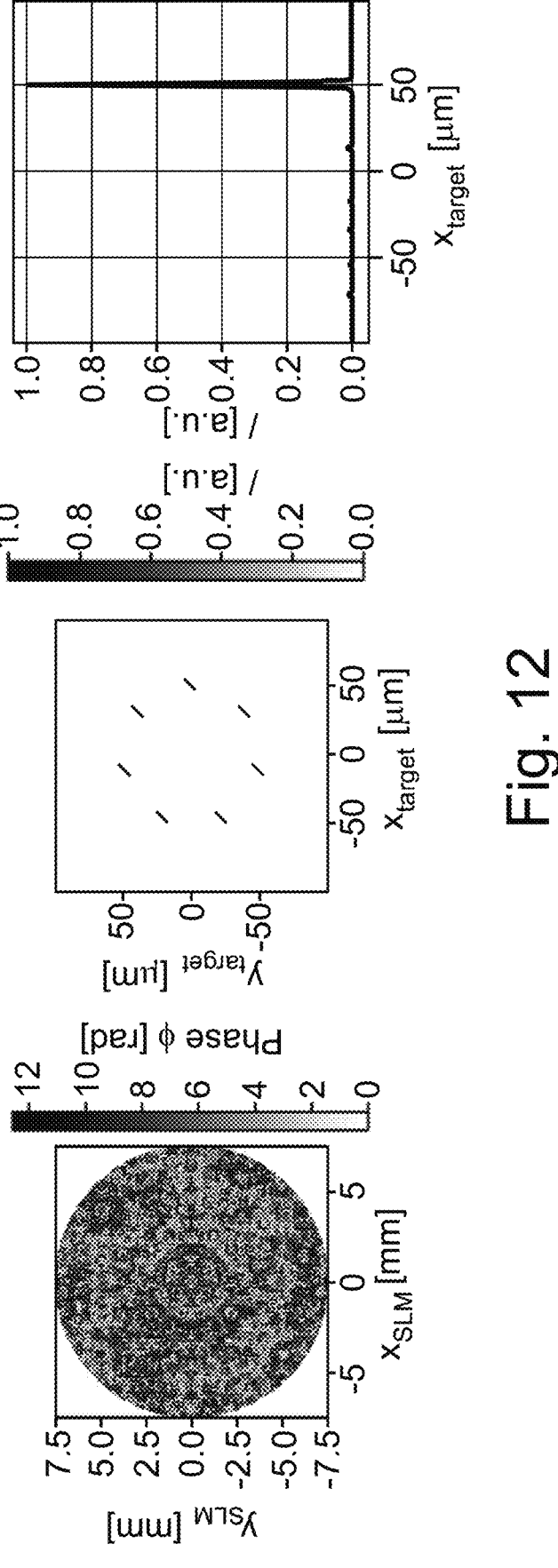
FIG. 12 qualitatively shows the phase distribution of the adaptation means of the third exemplary device, which causes a second arrangement of the foci, with the qualitative intensity distribution of the component beams within the material at the focal depth also being depicted. In this case, the foci comprise an astigmatism induced in a targeted manner.
Figure 15:
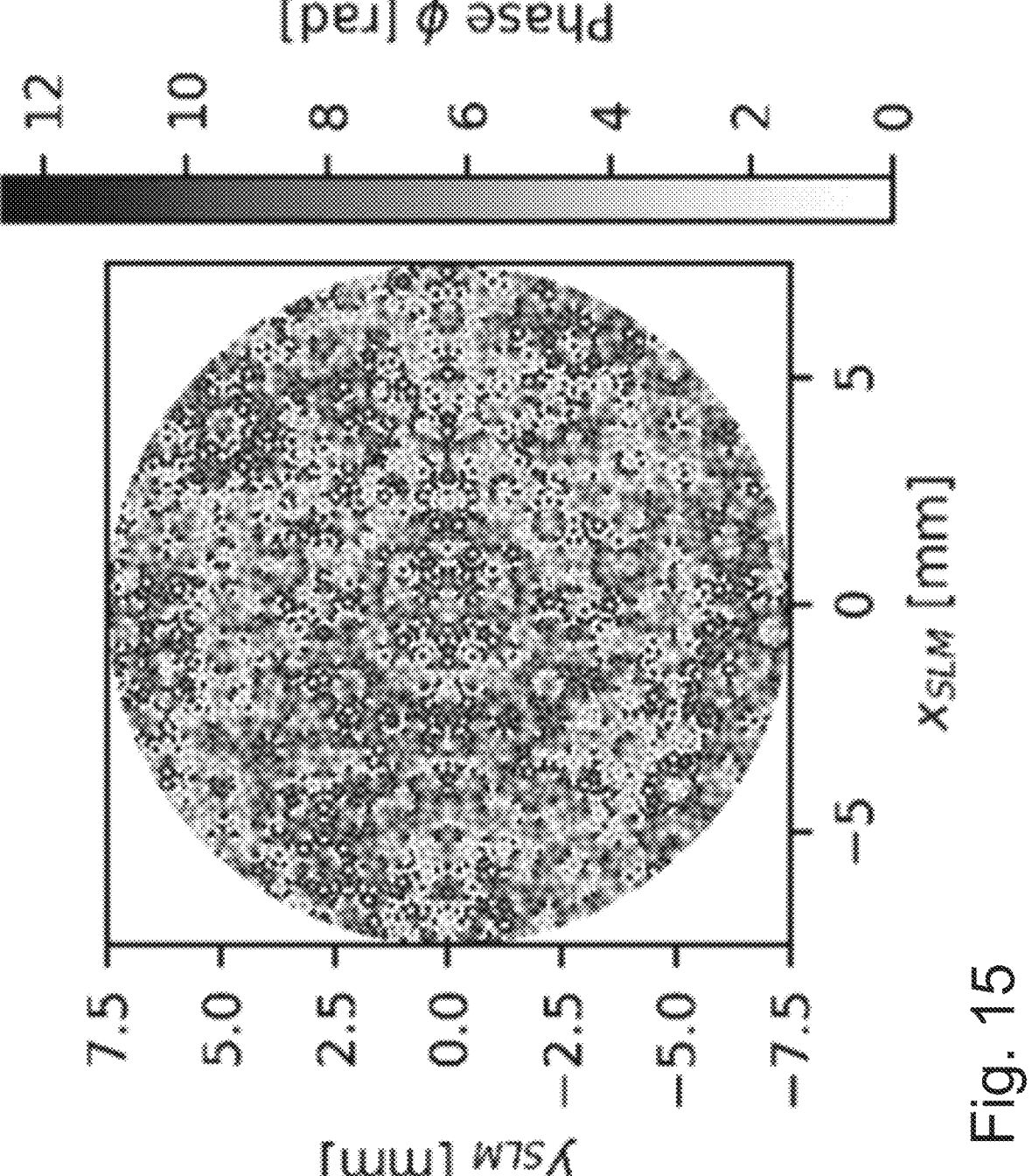
FIG. 15 shows an enlarged view of the phase distribution show n in FIG. 12.

FIG. 12 qualitatively shows the phase distribution of the phase modulator WB of the third exemplary device, which causes a second arrangement of the foci, with the qualitative intensity distribution of the component beams within the material at the focal depth also being depicted. FIG. 15 shows an enlarged view of the phase distribution shown in FIG. 12. It is possible to gather from this example (in the central diagram) that m=7 foci are present in a circular arrangement in the xy-plane at the focal depth. In this case, the foci have a linear or elongate form, with the "line" thereof making an angle with respect to the x-direction. A given focus quality, specifically an astigmatism, was induced in a targeted manner by way of the phase modulator WB in this arrangement. Thus, the foci are not rotationally symmetric. Here, the intensity distribution is illustrated in accordance with the known Fraunhofer diffraction.

Further, the implementation of this second arrangement of the foci can be discussed in more detail. The reference wavefront, which describes the focus quality, was chosen to be astigmatic for the second arrangement of the foci. As a result, it is thus possible to induce the given focus quality, in this case an astigmatic target wavefront, in a targeted manner within the material by way of the phase modulator WB. By way of example, the corresponding reference wavefront may be described by way of fringe Zernike coefficients in the process, for example using the (known) coefficient $c_5=0.8\lambda$. In this case, a defocus can be added by way of the (known) coefficients $c_4=0.5\lambda$ in order to generate a line-shaped focus at the depth d within the material T. In this case, inducing these astigmatic wavefronts, in combination with the generation of a plurality of m foci of the component beams and the addition of the focal depth-dependent optical path difference OPD $\Delta W(d)$ to the wavefronts of the component beams, requires a corresponding electric field, which in turn can be generated by way of the phase modulator WE. Since an astigmatic wavefront should now be additionally induced, the electric field at the phase modulator WB needs to be multiplied by an additional phase term $\Delta W(x_{SLM}, y_{SLM})$. In this case, the electric field to be generated can be described as:

$$E(x_{SLM}, y_{SLM}) = e^{-j2\pi\cdot(\Delta W(x_{SLM},y_{SLM})+\Delta W(d))}\sum_{i=1}^{m-1} e^{-j(k_{x,i}x_{SLM}+k_{y,i}y_{SLM})}.$$

Here, the plurality of line-shaped foci within the material can be generated by way of a suitable choice of $\Delta W(x_{SLM}, y_{SLM})$, with the result that these have a defocus ($c_4=0.5\lambda$) and an astigmatism ($c_5=0.8\lambda$). According to the known Zernike fringe polynomials, this can be implemented in a normalized Cartesian representation (with $$\bar{x}_{SLM} = \frac{x_{SLM}}{0.5\ D}, \bar{y}_{SLM} = \frac{y_{SLM}}{0.5\ D}),$$

where D represents the diameter of the phase modulator WB (e.g., an SLM) which is assumed to be circular. Accordingly, the additional wavefront can be chosen as follows, for example:

$$\Delta W(\overline{x}_{SLM}, \overline{y}_{SLM}) = 0.5 \cdot [2 \cdot \overline{x}_{SLM}^2 + 2 \cdot \overline{y}_{SLM}^2 - 1] + 0.8 \cdot [2\overline{x}_{SLM}\overline{y}_{SLM}].$$

In summary, the second arrangement, the induced astigmatism thereof and the number of foci (in this case m=7, for example) can be implemented by way of a suitable choice of the manipulated wavefront $\Delta W$ and suitable choice of $k_{x,i}$ and $k_{y,i}$.

Figure 16:
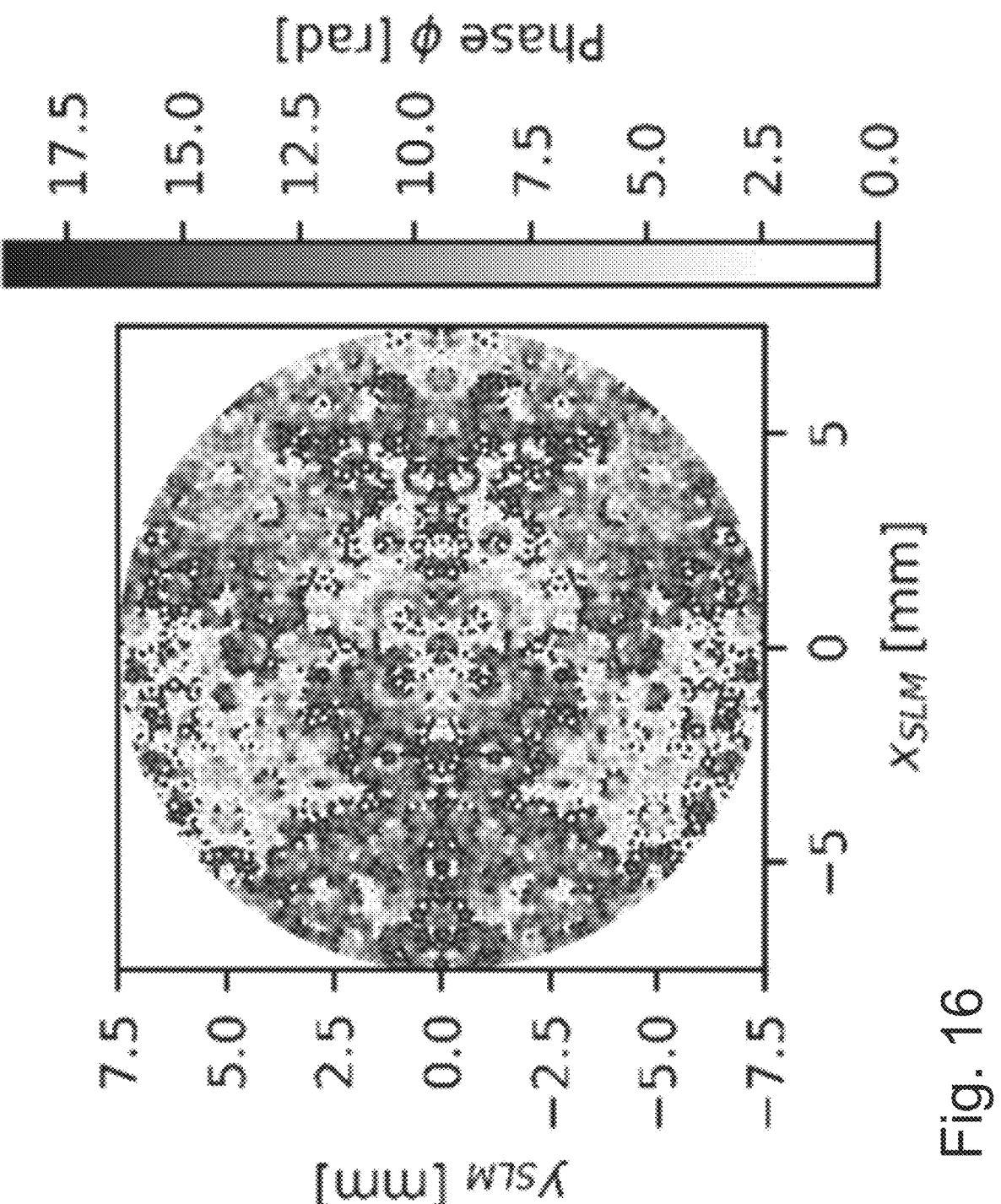
FIG. 16 show s an enlarged view of the phase distribution shown in FIG. 13.

FIG. 13 qualitatively shows the phase distribution of the adaptation means of the third exemplary device, which causes a third arrangement of the foci, with the qualitative intensity distribution of the component beams within the material at the focal depth also being depicted. FIG. 16 shows an enlarged view of the phase distribution shown in FIG. 13. In this case, the foci comprise an astigmatism induced in a targeted manner, wherein the orientation thereof was aligned in a targeted manner. Like in FIG. 12, it is identifiable that m=7 foci were generated in a circular arrangement. However, the alignment of the foci or the angle formed between the "line" of a focus and the x-axis differs from that of FIG. 12. From the central diagram, it is recognizable that, in the xy-plane of the focal depth, the alignment of the line-shaped foci is now parallel to the x-axis. By way of the phase modulator WB, it is therefore possible not only to induce any desired astigmatic focus qualities, but also to control the alignment or characteristic of the astigmatism of the wavefronts in a targeted manner. Thus, the induced focus quality can be designed with a high degree of freedom by way of the phase modulator WB.

Further, the implementation of the third arrangement can be discussed in greater detail. To this end, Zernike fringe coefficients can be chosen for the astigmatic terms, with for example the (known) Zernike fringe coefficients being able to be designed as follows: $c_4$=0.5λ, $c_5$=0.1λ and $c_6$=−0.8λ. Thus, the additional wavefront can be chosen as follows, for example:

$$\Delta W(\overline{x}_{SLM}, \overline{y}_{SLM}) =$$
$$0.5 \cdot [2 \cdot \overline{x}_{SLM}^2 + 2 \cdot \overline{y}_{SLM}^2 - 1] + 0.1 \cdot [2\overline{x}_{SLM}\overline{y}_{SLM}] - 0.8 \cdot [\overline{y}_{SLM}^2 - \overline{x}_{SLM}^2].$$

For example, the output of the wavefront sensor 4 (FIG. 10) can be provided to the computing unit for use in controlling the wavefront manipulator to control the introduction of the optical path difference $\Delta W(d)$. For example, the computing unit can be used to perform the simulations described above. For example, the computing unit can include one or more data processors configured to execute one or more computer programs that include a plurality of instructions according to the principles described above. The computing unit can include one or more data processors for processing data, one or more storage devices for storing data, such as one or more databases, and/or one or more computer programs including instructions that when executed by the computing unit cause the computing unit to carry out the processes. The computing unit can include one or more input devices, such as a keyboard, a mouse, a touchpad, and/or a voice command input module, and one or more output devices, such as a display, and/or an audio speaker. In some implementations, the computing unit can include digital electronic circuitry, computer hardware, firmware, software, or any combination of the above. The features related to processing of data can be implemented in a computer program product tangibly embodied in an information carrier, e.g., in a machine-readable storage device, for execution by a programmable processor; and method steps can be performed by a programmable processor executing a program of instructions to perform functions of the described implementations. Alternatively or in addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

A computer program can be written in any form of programming language, including compiled or interpreted languages, and it can be deployed in any form, including as a stand-alone program or as a module, component, subroutine, or other unit suitable for use in a computing environment.

For example, the computing unit can be configured to be suitable for the execution of a computer program and can include, by way of example, both general and special purpose microprocessors, and any one or more processors of any kind of digital computer. Generally, a processor will receive instructions and data from a read-only storage area or a random access storage area or both. Elements of a computer system include one or more processors for executing instructions and one or more storage area devices for storing instructions and data. Generally, a computer system will also include, or be operatively coupled to receive data from, or transfer data to, or both, one or more machine-readable storage media, such as hard drives, magnetic disks, solid state drives, magneto-optical disks, or optical disks. Machine-readable storage media suitable for embodying computer program instructions and data include various forms of non-volatile storage area, including by way of example, semiconductor storage devices, e.g., EPROM, EEPROM, flash storage devices, and solid state drives; magnetic disks, e.g., internal hard disks or removable disks; magneto-optical disks; and CD-ROM, DVD-ROM, and/or Blu-ray discs.

In some implementations, the processes described above can be implemented using software for execution on one or more mobile computing devices, one or more local computing devices, and/or one or more remote computing devices (which can be, e.g., cloud computing devices). For instance, the software forms procedures in one or more computer programs that execute on one or more programmed or programmable computer systems, either in the mobile computing devices, local computing devices, or remote computing systems (which may be of various architectures such as distributed, client/server, grid, or cloud), each including at least one processor, at least one data storage system (including volatile and non-volatile memory and/or storage elements), at least one wired or wireless input device or port, and at least one wired or wireless output device or port.

In some implementations, the software may be provided on a medium, such as CD-ROM, DVD-ROM, Blu-ray disc, a solid state drive, or a hard drive, readable by a general or special purpose programmable computer or delivered (encoded in a propagated signal) over a network to the computer where it is executed. The functions can be performed on a special purpose computer, or using special-purpose hardware, such as coprocessors. The software can be implemented in a distributed manner in which different pails of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system can also be considered to be implemented as a computer-readable storage medium, configured with a computer program, where the storage medium so configured causes a computer system to operate in a specific and predefined manner to perform the functions described herein.

While the disclosure has been described in connection with certain examples, it is to be understood that the disclosure is not to be limited to the disclosed examples but, on the contrary, is intended to cover various modifications and equivalent arrangements included within the scope of the appended claims, which scope is to be accorded the broadest interpretation so as to encompass all such modifications and equivalent structures as is permitted under the law.

Subsequently further examples according to the disclosure are described.

Example 1: A device for focusing a photon beam into a material, comprising:

a splitter for splitting the photon beam into a plurality of component beams;

a focusing unit for focusing the component beams at a predetermined focal depth within the material; and a wavefront manipulator for adapting the wavefronts of the component beams based at least in part on the focal depth.

Example 2: The device of Example 1, wherein the wavefront manipulator is configured in such a way that the wavefronts are adapted so as to generate a first given focus quality of the foci of the component beams at a first predetermined focal depth.

Example 3: The device of Example 2, wherein the wavefront manipulator is configured in such a way that the wavefronts are adapted so as to generate a second given focus quality of the foci of the component beams at a second predetermined focal depth.

Example 4: The device of Example 2, wherein the given focus quality is based at least partially on a target state of the wavefronts at the focal depth.

Example 5: The device of Example 4, wherein the given focus quality is based at least in part on a target state of the wavefronts in a plane of the device, which corresponds to a transformation of the target state of the wavefronts at the focal depth.

Example 6: The device of Example 4, wherein the given focus quality comprises a comparison measure of the target state of the wavefronts at the focal depth and/or target state of the wavefronts in the plane of the apparatus with respect to a corresponding actual state of the wavefronts.

Example 7: The device of Example 6, wherein the comparison measure comprises a root mean square (RMS) wavefront error of the actual state at the focal depth with respect to the target state at the focal depth of less than 500 $m\lambda$, preferably less than 200 $m\lambda$, more preferably less than 100 $m\lambda$, most preferably less than 50 $m\lambda$.

Example 8: The device of Example 1, wherein the device comprises a detector for determining the actual state of the wavefronts, preferably the actual state in a plane of the device and/or at the predetermined focal depth, and a loop controller for controlling the wavefront manipulator based on a deviation of the determined actual state of the wavefronts with respect to a target state of the wavefronts.

Example 9: The device of Example 1, wherein the wavefront manipulator is configured to adapt the wavefronts based at least in part on a refractive index difference experienced by the focused component beams.

Example 10 The device of Example 9, wherein the refractive index difference is caused by a refractive index of a medium adjoining the material and a refractive index of the material.

Example 11: The device of Example 1, wherein the wavefront manipulator is configured in such a way that it adapts the wavefront of the photon beam in order to adapt the wavefronts of the component beams.

Example 12: The device of Example 1, wherein the splitter is configured so that at least two component beams have substantially the same energy and/or substantially the same power.

Example 13: The device of Example 1, wherein the splitter splits the photon beam into a plurality of component beams by way of a diffraction of the photon beam; and/or wherein the splitter splits the photon beam into a plurality of component beams by way of a local phase modulation of the photon beam.

Example 14: The device of Example 1, wherein the splitter comprises the wavefront manipulator, with the wavefront manipulator being configured to adapt the wavefront of the photon beam such that the latter is split into the plurality of component beams at the same time.

Example 15: The device of Example 1, wherein the splitter is configured to cause a predetermined geometric distribution of the foci of the component beams in the material.

Example 16: The device of Example 1, wherein the splitter is arranged in a surround of a pupil and/or in a surround of a conjugate pupil of the means for focusing in the device, in such a way that the component beams are substantially encompassed in the diameter of the pupil of the means for focusing.

Example 17: The device of Example 16, wherein the splitter is arranged at a position relative to the pupil so that an intersection of a direction ray of a component beam with a plane of the pupil includes a distance from the center of the pupil of no more than 10% of the diameter, preferably no more than 1% of the diameter, most preferably no more than 0.1% of the diameter of the pupil.

Example 18: The device of Example 16, wherein the splitter is arranged at a position relative to the pupil so that the intersections of the direction rays of at least two component beams with the plane of the pupil are arranged within the pupil, and a distance between the intersections is no more than 10% of the diameter of the pupil, preferably no more than 1% of the diameter of the pupil, most preferably no more than 0.1% of the diameter of the pupil.

Example 19: The device of Example 2, wherein the focusing unit is configured so that the given focus quality can be generated without an adaptation of the wavefronts for a predetermined compensated focal depth and for wavefronts incident in substantially planar fashion on the means for focusing.

Example 20: The device of Example 1, wherein the device is configured so that the focal depth is adjusted by displacing the means for focusing and/or by displacing the material.

Example 21: The device of Example 1, wherein the device comprises a deflection unit for laterally deflecting the focused component beams in a focal depth plane formed by the foci of the component beams.

Example 22: The device of Example 21, wherein the deflection unit comprises the splitter and/or the wavefront manipulator.

Example 23: The device of Example 1, wherein the device is configured to focus the photon beam into a lithography mask.

Example 24: The device of Example 1, wherein the device is configured to focus the photon beam into a photopolymer, preferably in order to cause a multiphoton polymerization of the photopolymer.

Example 25: The device of Example 1, wherein the device is configured to focus the photon beam into a glass, preferably in order to cause a drilled hole in the glass, in order to cut the glass and/or in order to structure the glass.

Example 26: A method for focusing a photon beam into a material, the method comprising:

directing a photon beam at a splitter for splitting the photon beam such that the photon beam is split into a plurality of component beams;

focusing the component beams within the material, with the component beams being focused at a predetermined focal depth within the material; and adapting the wavefronts of the component beams based at least in part on the focal depth.

Example 27: The method of Example 26, wherein the wavefronts are adapted so as to generate a given focus quality of the foci of the component beams at the predetermined focal depth.

Example 28: A method for determining a target state of a wavefront, the method comprising:

simulating a course of a photon beam by way of a simulation set-up which is at least based on a focusing unit of the device of Example 1 and a material;

defining a target state of a wavefront of the photon beam and/or of a component beam at a predetermined focal depth within the material; and transforming the target state of the wavefront at the focal depth into a corresponding target state of the wavefront in a plane of the simulated device.

Example 29: A computer program comprising instructions which, when executed by a device of Example 1 and/or by a computer, cause the device and/or the computer to carry out a method of Example 26.

Example 30: An apparatus for focusing a photon beam into a material comprising:

a splitter comprising one or more optical elements configured to split the photon beam into component beams;

a focusing unit comprising one or more lenses configured to focus the component beams at a predetermined focal depth within the material; and a wavefront manipulator comprising one or more optical components configured to adjust at least one of a phase, an amplitude, or a polarization of one or more portions of the component beams to adapt the wavefronts of the component beams based at least in part on the focal depth.

Example 31: The apparatus of Example 30, wherein the splitter comprises an optical glass having diffractive features configured to split the photon beam into the component beams.

Example 32: The apparatus of Example 30, wherein the splitter comprises a diffractive grating configured to split the photon beam into the component beams.

Example 33: The apparatus of Example 30, wherein the splitter comprises a phase modulator configured to locally change the phase of the photon beam at a plurality of locations.

Example 34: The apparatus of Example 33, wherein the phase modulator comprises at least one of an adaptive optical unit, a deformable mirror, or a spatial light modulator configured to locally change the phase of the photon beam at the plurality of locations.

Example 35: The apparatus of Example 34 wherein the splitter and the wavefront adaptor are designed as an integrated unit that comprises the spatial light modulator, wherein the spatial light modulator is configured to adapt the wavefronts of the component beams based at least in part on the focal depth.

Example 36: The apparatus of Example 30, comprising a sensor to detect an actual state of the wavefronts, and a computing unit configured to control the wavefront adaptor based on a deviation of the actual state of the wavefronts with respect to a target state of the wavefronts.

Example 37: An apparatus comprising:

a phase modulator configured to split a photon beam into component beams, wherein the phase modulator comprises one or more optical elements configured to locally change the phase of the photon beam to split the photon beam into the component beams; and a focusing unit comprising one or more lenses configured to focus the component beams at a predetermined focal depth within a material;

wherein the phase modulator is configured to adapt the wavefronts of the component beams based at least in part on the focal depth.

Example 38: The apparatus of Example 37, wherein the phase modulator comprises a spatial light modulator configured to locally change the phase of the photon beam at the plurality of locations.

Example 39: A method comprising:

generating component beams based on a photon beam;

focusing the component beams at a focal depth within a material; and adapting the wavefronts of the component beams based at least in part on the focal depth.

Example 40: The method of Example 39, wherein generating component beams comprises using a diffraction grating to process the photon beam and generate the component beams by diffraction.

Example 41: The method of Example 39, wherein generating component beams comprises using a phase modulator to locally change the phase of the photon beam at several locations to generate the component beams.

Example 42: The method of Example 39, wherein focusing the component beams at a focal depth within a material comprises focusing the component beams at the focal depth within a glass material, wherein the method comprises using focused component beams to cause structural changes to the glass material.

Example 43: The method of Example 39, wherein focusing the component beams at a focal depth within a material comprises focusing the component beams at the focal depth within a photolithography mask, wherein the method comprises using focused component beams to cause structural changes to the photolithography mask.

Example 44: A computer-implemented method for determining a target state of a wavefront, the method comprising:

simulating, using one or more data processors, a course of a photon beam by use is of a simulation set-up that is at least based on an apparatus and a material, wherein the apparatus is configured to focus the photon beam into the material;

defining, using the one or more data processors, a target state of a wavefront of the photon beam and/or of a component beam at the focal depth within the material, wherein the component beam is derived from the photon beam; and transforming, using the one or more data processors, the target state of the wavefront at the focal depth into a corresponding target state of the wavefront in a plane of the apparatus that is configured to focus the photon beam into the material.

What is claimed is:

1. A device for focusing a photon beam into a material, comprising:

means for splitting the photon beam into a plurality of component beams;

means for focusing the component beams at a predetermined focal depth within the material; and means for adapting the wavefronts of the component beams based at least in part on the focal depth.

2. The device of claim 1, wherein the means for adapting is configured in such a way that the wavefronts are adapted so as to generate a first given focus quality of the foci of the component beams at a first predetermined focal depth.

3. The device of claim 2, wherein the means for adapting is configured in such a way that the wavefronts are adapted so as to generate a second given focus quality of the foci of the component beams at a second predetermined focal depth.

4. The device of claim 2, wherein the given focus quality is based at least partially on a target state of the wavefronts at the focal depth.

5. The device of claim 4, wherein the given focus quality is based at least in part on a target state of the wavefronts in a plane of the device, which corresponds to a transformation of the target state of the wavefronts at the focal depth.

6. The device of claim 4, wherein the given focus quality comprises a comparison measure of the target state of the wavefronts at the focal depth and/or target state of the wavefronts in the plane of the apparatus with respect to a corresponding actual state of the wavefronts.

7. The device of claim 6, wherein the comparison measure comprises a root mean square (RMS) wavefront error of the actual state at the focal depth with respect to the target state at the focal depth of less than 500 m$\lambda$, preferably less than 200 m$\lambda$, more preferably less than 100 m$\lambda$, most preferably less than 50 m$\lambda$.

8. The device of claim 1, wherein the device comprises a means for determining the actual state of the wavefronts, preferably the actual state in a plane of the device and/or at the predetermined focal depth, and a means for controlling the means for adapting based on a deviation of the determined actual state of the wavefronts with respect to a target state of the wavefronts.

9. The device of claim 1, wherein the means for adapting is configured to adapt the wavefronts based at least in part on a refractive index difference experienced by the focused component beams.

10. The device of claim 9, wherein the refractive index difference is caused by a refractive index of a medium adjoining the material and a refractive index of the material.

11. The device of claim 1, wherein the means for adapting is configured in such a way that it adapts the wavefront of the photon beam in order to adapt the wavefronts of the component beams.

12. The device of claim 1, wherein the means for splitting is configured so that at least two component beams have substantially the same energy and/or substantially the same power.

13. The device of claim 1, wherein the means for splitting splits the photon beam into a plurality of component beams by way of a diffraction of the photon beam; and/or wherein the means for splitting splits the photon beam into a plurality of component beams by way of a local phase modulation of the photon beam.

14. The device of claim 1, wherein the means for splitting comprises the means for adapting, with the means for adapting being configured to adapt the wavefront of the photon beam such that the latter is split into the plurality of component beams at the same time.

15. The device of claim 1, wherein the means for splitting is configured to cause a predetermined geometric distribution of the foci of the component beams in the material.

16. The device of claim 1, wherein the means for splitting is arranged in a surround of a pupil and/or in a surround of a conjugate pupil of the means for focusing in the device, in such a way that the component beams are substantially encompassed in the diameter of the pupil of the means for focusing.

17. The device of claim 16, wherein the means for splitting is arranged at a position relative to the pupil so that an intersection of a direction ray of a component beam with a plane of the pupil includes a distance from the center of the pupil of no more than 10% of the diameter, preferably no more than 1% of the diameter, most preferably no more than 0.1% of the diameter of the pupil.

18. The device of claim 16, wherein the means for splitting is arranged at a position relative to the pupil so that the intersections of the direction rays of at least two component beams with the plane of the pupil are arranged within the pupil, and a distance between the intersections is no more than 10% of the diameter of the pupil, preferably no more than 1% of the diameter of the pupil, most preferably no more than 0.1% of the diameter of the pupil.

19. The device of claim 2, wherein the means for focusing is configured so that the given focus quality can be generated without an adaptation of the wavefronts for a predetermined compensated focal depth and for wavefronts incident in substantially planar fashion on the means for focusing.

20. The device of claim 1, wherein the device is configured so that the focal depth is adjusted by displacing the means for focusing and/or by displacing the material.

21. The device of claim 1, wherein the device comprises a means for laterally deflecting the focused component beams in a focal depth plane formed by the foci of the component beams.

22. The device of claim 21, wherein the means for laterally deflecting comprises the means for splitting and/or the means for adapting.

23. The device of claim 1, wherein the device is configured to focus the photon beam into a lithography mask.

24. The device of claim 1, wherein the device is configured to focus the photon beam into a photopolymer, preferably in order to cause a multiphoton polymerization of the photopolymer.

25. The device of claim 1, wherein the device is configured to focus the photon beam into a glass, preferably in order to cause a drilled hole in the glass, in order to cut the glass and/or in order to structure the glass.

26. A method for focusing a photon beam into a material, the method comprising:

directing a photon beam at a means for splitting the photon beam such that the photon beam is split into a plurality of component beams;

focusing the component beams within the material, with the component beams being focused at a predetermined focal depth within the material; and adapting the wavefronts of the component beams based at least in part on the focal depth.

27. The method of claim 26, wherein the wavefronts are adapted so as to generate a given focus quality of the foci of the component beams at the predetermined focal depth.

28. A method for determining a target state of a wavefront, the method comprising:

simulating a course of a photon beam by way of a simulation set-up which is at least based on a means for focusing of the device of claim 1 and a material;

defining a target state of a wavefront of the photon beam and/or of a component beam at a predetermined focal depth within the material; and transforming the target state of the wavefront at the focal depth into a corresponding target state of the wavefront in a plane of the simulated device.

29. A computer program comprising instructions which, when executed by a device for focusing a photon beam into a material and/or by a computer, cause the device and/or the computer to carry out a method for focusing the photon beam into the material, wherein the device comprises:

means for splitting the photon beam into a plurality of component beams;

means for focusing the component beams at a predetermined focal depth within the material; and means for adapting the wavefronts of the component beams based at least in part on the focal depth;

wherein the method comprises:

directing the photon beam at the means for splitting the photon beam such that the photon beam is split into the plurality of component beams;

focusing the component beams within the material, with the component beams being focused at the predetermined focal depth within the material; and adapting the wavefronts of the component beams based at least in part on the focal depth.

30. An apparatus for focusing a photon beam into a material comprising:

a splitter comprising one or more optical elements configured to split the photon beam into component beams;

a focusing unit comprising one or more lenses configured to focus the component beams at a predetermined focal depth within the material; and a wavefront manipulator comprising one or more optical components configured to adjust at least one of a phase, an amplitude, or a polarization of one or more portions of the component beams to adapt the wavefronts of the component beams based at least in part on the focal depth.

31. An apparatus comprising:

a phase modulator configured to split a photon beam into component beams, wherein the phase modulator comprises one or more optical elements configured to locally change the phase of the photon beam to split the photon beam into the component beams; and a focusing unit comprising one or more lenses configured to focus the component beams at a predetermined focal depth within a material;

wherein the phase modulator is configured to adapt the wavefronts of the component beams based at least in part on the focal depth.

32. A method comprising:

generating component beams based on a photon beam;

focusing the component beams at a focal depth within a material; and adapting the wavefronts of the component beams based at least in part on the focal depth.

33. A computer-implemented method for determining a target state of a wavefront, the method comprising:

simulating, using one or more data processors, a course of a photon beam by use of a simulation set-up that is at least based on an apparatus and a material, wherein the apparatus is configured to focus the photon beam into the material;

defining, using the one or more data processors, a target state of a wavefront of the photon beam and/or of a component beam at the focal depth within the material, wherein the component beam is derived from the photon beam; and transforming, using the one or more data processors, the target state of the wavefront at the focal depth into a corresponding target state of the wavefront in a plane of the apparatus that is configured to focus the photon beam into the material.

* * * * *